(12) United States Patent
Yada et al.

(10) Patent No.: US 9,548,313 B2
(45) Date of Patent: Jan. 17, 2017

(54) METHOD OF MAKING A MONOLITHIC THREE DIMENSIONAL NAND STRING USING A SELECT GATE ETCH STOP LAYER

(71) Applicant: SanDisk Technologies, Inc., Plano, TX (US)

(72) Inventors: Shinsuke Yada, Yokkaichi (JP);
Shigehiro Fujino, Yokkaichi (JP);
Hajime Kimura, Yokkaichi (JP);
Masanori Terahara, Yokkaichi (JP);
Ryoichi Honma, Yokkaichi (JP);
Hiroyuki Ogawa, Yokkaichi (JP);
Ryousuke Itou, Yokkaichi (JP)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 14/725,466

(22) Filed: May 29, 2015

(65) Prior Publication Data

US 2015/0348984 A1 Dec. 3, 2015

Related U.S. Application Data

(60) Provisional application No. 62/004,990, filed on May 30, 2014.

(51) Int. Cl.
*H01L 21/336* (2006.01)
*H01L 27/115* (2006.01)

(52) U.S. Cl.
CPC ..... *H01L 27/11556* (2013.01); *H01L 27/1157* (2013.01); *H01L 27/11524* (2013.01); *H01L 27/11582* (2013.01)

(58) Field of Classification Search
None
See application file for complete search history.

(56) References Cited

U.S. PATENT DOCUMENTS 5,915,167 A * 6/1999 Leedy ............... G11O 5/02
257/E21.597
5,985,753 A * 11/1999 Yu ............... H01L 21/0337
257/E21.038

(Continued)

FOREIGN PATENT DOCUMENTS

KR 2009-0001377 A 1/2009
WO WO 02/15277 A2 2/2002

OTHER PUBLICATIONS

Endoh et al., "Novel Ultra High Density Memory with a Stacked-Surrounding Gate Transistor (S-SGT) Structured Cell," IEDM Proc. (2001) 33-36.

(Continued)

*Primary Examiner* — David E Graybill
(74) *Attorney, Agent, or Firm* — The Marbury Law Group PLLC

(57) ABSTRACT

A method of making a monolithic three dimensional NAND string includes forming a select gate layer of a third material over a major surface of a substrate, forming a stack of alternating first material and second material layers over the select gate layer, where the first material, the second material and the third material are different from each other, and etching the stack using a first etch chemistry to form at least one opening in the stack at least to the select gate layer, such that the select gate layer acts as an etch stop layer during the step of etching.

17 Claims, 9 Drawing Sheets

(56) References Cited

U.S. PATENT DOCUMENTS

| | | | | |
|---|---|---|---|---|
| 6,953,697 B1* | 10/2005 | Castle | H01L 22/12 | 257/E21.53 |
| 7,005,350 B2* | 2/2006 | Walker | H01L 27/11568 | 257/344 |
| 7,023,739 B2* | 4/2006 | Chen | G11C 11/5671 | 365/185.02 |
| 7,177,191 B2* | 2/2007 | Fasoli | H01L 27/11551 | 257/E27.103 |
| 7,221,588 B2* | 5/2007 | Fasoli | G11C 16/04 | 257/314 |
| 7,233,522 B2* | 6/2007 | Chen | G11C 16/0483 | 257/E21.663 |
| 7,238,983 B2* | 7/2007 | Ding | H01L 27/115 | 257/316 |
| 7,514,321 B2* | 4/2009 | Mokhlesi | H01L 27/115 | 257/315 |
| 7,575,973 B2* | 8/2009 | Mokhlesi | H01L 27/11582 | 257/E21.103 |
| 7,745,265 B2* | 6/2010 | Mokhlesi | H01L 27/11582 | 257/E21.598 |
| 7,808,038 B2* | 10/2010 | Mokhlesi | H01L 27/115 | 257/302 |
| 7,848,145 B2* | 12/2010 | Mokhlesi | H01L 27/11568 | 365/185.05 |
| 7,851,851 B2* | 12/2010 | Mokhlesi | H01L 27/115 | 257/326 |
| 8,008,710 B2* | 8/2011 | Fukuzumi | G11C 5/02 | 257/326 |
| 8,053,829 B2* | 11/2011 | Kang | H01L 27/115 | 257/324 |
| 8,187,936 B2* | 5/2012 | Alsmeier | H01L 27/11551 | 257/324 |
| 8,614,126 B1* | 12/2013 | Lee | H01L 21/764 | 257/E29.309 |
| 8,716,089 B1* | 5/2014 | Hall | H01L 29/42344 | 257/E21.691 |
| 8,735,965 B2* | 5/2014 | Ishihara | H01L 29/66833 | 257/324 |
| 8,741,719 B1* | 6/2014 | Hall | H01L 29/66545 | 438/257 |
| 8,828,884 B2* | 9/2014 | Lee | H01L 21/76816 | 257/E21.246 |
| 8,878,278 B2* | 11/2014 | Alsmeier | G11C 16/04 | 257/314 |
| 8,901,632 B1* | 12/2014 | Perera | H01L 29/7831 | 257/314 |
| 9,023,719 B2* | 5/2015 | Pachamuthu | H01L 21/28282 | 257/316 |
| 9,227,456 B2* | 1/2016 | Chien | B42D 15/02 | |
| 9,431,410 B2* | 8/2016 | Sun | H01L 27/11556 | |
| 9,437,604 B2* | 9/2016 | Lu | H01L 27/11556 | |
| 2002/0168849 A1* | 11/2002 | Lee | H01L 21/31111 | 438/637 |
| 2006/0068592 A1 | 3/2006 | Dostalik | H01L 21/02063 | 438/706 |
| 2007/0210338 A1* | 9/2007 | Orlowski | H01L 29/66825 | 257/213 |
| 2007/0252201 A1* | 11/2007 | Kito | H01L 21/8221 | 257/331 |
| 2008/0258308 A1* | 10/2008 | Liu | H01L 21/02063 | 257/774 |
| 2010/0044778 A1* | 2/2010 | Seol | H01L 21/28273 | 257/326 |
| 2010/0112769 A1* | 5/2010 | Son | H01L 21/8221 | 438/261 |
| 2010/0120214 A1* | 5/2010 | Park | H01L 27/11578 | 438/287 |
| 2010/0155810 A1* | 6/2010 | Kim | H01L 27/11548 | 257/316 |
| 2010/0155818 A1* | 6/2010 | Cho | H01L 27/11578 | 257/324 |
| 2010/0181610 A1* | 7/2010 | Kim | H01L 29/7926 | 257/314 |
| 2010/0207195 A1* | 8/2010 | Fukuzumi | G11C 16/0483 | 257/326 |
| 2010/0309729 A1* | 12/2010 | Chang | H01L 21/28282 | 365/185.28 |
| 2010/0320528 A1* | 12/2010 | Jeong | H01L 27/105 | 257/324 |
| 2011/0076819 A1* | 3/2011 | Kim | H01L 27/11551 | 438/279 |
| 2011/0133606 A1* | 6/2011 | Yoshida | H02N 2/004 | 310/356 |
| 2011/0147824 A1* | 6/2011 | Son | G11C 16/0483 | 257/324 |
| 2011/0266606 A1 | 11/2011 | Park et al. | | |
| 2011/0291177 A1* | 12/2011 | Lee | H01L 21/28282 | 257/324 |
| 2012/0001247 A1* | 1/2012 | Alsmeier | H01L 27/11551 | 257/316 |
| 2012/0001249 A1* | 1/2012 | Alsmeier | H01L 27/11551 | 257/319 |
| 2012/0001250 A1* | 1/2012 | Alsmeier | H01L 27/11551 | 257/319 |
| 2012/0034785 A1* | 2/2012 | Hayashi | H01L 21/31116 | 438/706 |
| 2012/0146127 A1* | 6/2012 | Lee | H01L 21/28282 | 257/324 |
| 2012/0256247 A1* | 10/2012 | Alsmeier | H01L 21/764 | 257/319 |
| 2013/0069139 A1* | 3/2013 | Ishihara | H01L 29/66833 | 257/324 |
| 2013/0069140 A1* | 3/2013 | Ichinose | H01L 27/11582 | 257/324 |
| 2013/0105881 A1* | 5/2013 | Kai | H01L 29/42332 | 257/319 |
| 2013/0248974 A1* | 9/2013 | Alsmeier | G11C 16/04 | 257/321 |
| 2014/0003148 A1* | 1/2014 | Sun | H01L 29/7889 | 365/185.17 |
| 2014/0264533 A1* | 9/2014 | Simsek-Ege | H01L 27/1158 | 257/316 |
| 2014/0264542 A1* | 9/2014 | Simsek-Ege | H01L 29/7926 | 257/324 |
| 2014/0291747 A1* | 10/2014 | Simsek-Ege | H01L 29/7889 | 257/316 |
| 2015/0076580 A1* | 3/2015 | Pachamuthu | H01L 27/11551 | 257/314 |
| 2015/0076584 A1* | 3/2015 | Pachamuthu | H01L 21/28282 | 257/315 |
| 2015/0079765 A1* | 3/2015 | Pachamuthu | H01L 21/28282 | 438/478 |
| 2015/0091073 A1* | 4/2015 | Li | H01L 29/7881 | 257/316 |
| 2015/0123188 A1* | 5/2015 | Lu | H01L 27/11556 | 257/321 |
| 2015/0123189 A1* | 5/2015 | Sun | H01L 27/11556 | 257/321 |
| 2015/0333143 A1* | 11/2015 | Meldrim | H01L 27/11582 | 257/314 |
| 2016/0071876 A1* | 3/2016 | Mizuno | H01L 27/11582 | 365/185.17 |
| 2016/0133638 A1* | 5/2016 | Simsek-Ege | H01L 27/11524 | 257/314 |

OTHER PUBLICATIONS

U.S. Appl. No. 14/133,979, filed Dec. 19, 2013, SanDisk Technologies Inc.

Jang et al., "Vertical Cell Array Using TCAT (Terabit Cell Array Transistor) Technology for Ultra High Density NAND Flash Memory," 2009 Symposium on VLSI Technology Digest of Technical Papers, pp. 192-193.

Katsumata et al., "Pipe-Shaped BiCS Flash Memory with 16 Stacked Layers and Multi-Level-Cell Operation for Ultra High Density Storage Devices," 2009 Symposium on VLSI Technology

(56) References Cited

OTHER PUBLICATIONS

Digest of Technical Papers, pp. 136-137.
Maeda et al., "Multi-Stacked 1G Cell/Layer Pipe-Shaped BiCS Flash Memory," 2009 Symposium on VLSI Technology Digest of Technical Papers, pp. 22-23.
Tanaka et al., "Bit-Cost Scalable Technology for Low-Cost and Ultrahigh-Density Flash Memory," Toshiba Review, vol. 63, No. 2, 2008, pp. 28-31.
Masahide Kimura, "3D Cells Make Terabit NAND Flash Possible," Nikkei Electronics Asia, Sep. 17, 2009, 6pgs.
International Search Report & Written Opinion, PCT/US2011/042566, Jan. 17, 2012.
Invitation to Pay Additional Fees & Partial International Search Report, PCT/US2011/042566, Sep. 28, 2011.
Jang et al., "Memory Properties of Nickel Silicide Nanocrystal Layer for Possible Application to Nonvolatile Memory Devices," IEEE Transactions on Electron Devices, vol. 56, No. 12, Dec. 2009.
Chen et al., "Reliability Characteristics of NiSi Nanocrystals Embedded in Oxide and Nitride Layers for Nonvolatile Memory Application," Applied Physics Letters 92, 152114 (2008).
Geil et al., "Etch Resistance of Focused-Ion-Beam-Implanted $SiO_2$," LEOS 1991: Summer Topical Meetings on Epitaxial Materials and In-situ Processing for Optoelectronic Devices, Jul. 29-31, 1991 and Microfabrication for Photonics and Optoelectronics, Jul. 31-Aug. 2, 1991.
Qian et al., "Fabrication of Si Microstructures Using Focused Ion Beam Implantation and Reactive Ion Etching," 2008 J. Micromech. Microeng. 18, 035003, 5pgs.
Sievila et al., "The Fabrication of Silicon Nanostructures by Focused-Ion-Beam Implantation and TMAH Wet Etching," 2010 Nanotechnology, 21, 145301, 6pgs.
Chekurov et al., "The Fabrication of Silicon Nanostructures by Local Gallium Implantation and Cryogenic Deep Reactive Ion Etching," 2009 Nanotechnology, 20, 065307, 5pgs.
International Search Report and Written Opinion for PCT/US2014/044833, mailed Oct. 2, 2014.
U.S. Appl. No. 13/443,287, filed Apr. 10, 2012, SanDisk Technologies Inc.
U.S. Appl. No. 13/478,483, filed May 23, 2012, SanDisk Technologies Inc.
U.S. Appl. No. 13/544,328, filed Jul. 9, 2012, SanDisk Technologies Inc.
U.S. Appl. No. 13/586,413, filed Aug. 15, 2012, SanDisk Technologies Inc.
U.S. Appl. No. 13/754,293, filed Jan. 30, 2013, SanDisk Technologies Inc.
U.S. Appl. No. 14/225,176, filed Mar. 25, 2014, SanDisk Technologies Inc.
U.S. Appl. No. 14/341,079, filed Jul. 25, 2014, SanDisk Technologies Inc.
U.S. Appl. No. 14/530,220, filed Oct. 31, 2014, SanDisk Technologies Inc.
U.S. Appl. No. 14/560,444, filed Dec. 4, 2014, SanDisk Technologies Inc.
U.S. Appl. No. 14/659,963, filed Mar. 17, 2015, SanDisk Technologies Inc.

\* cited by examiner

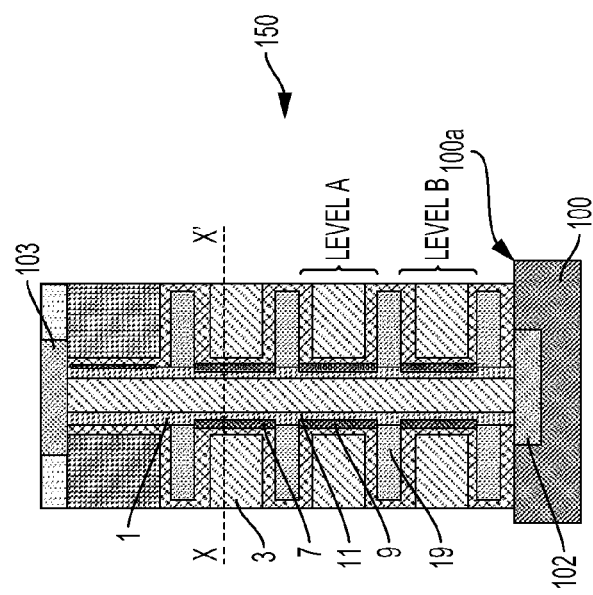
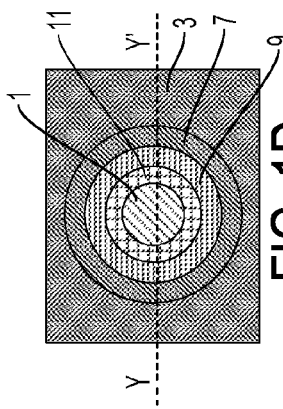
FIG. 1A PRIOR ART
FIG. 1B PRIOR ART
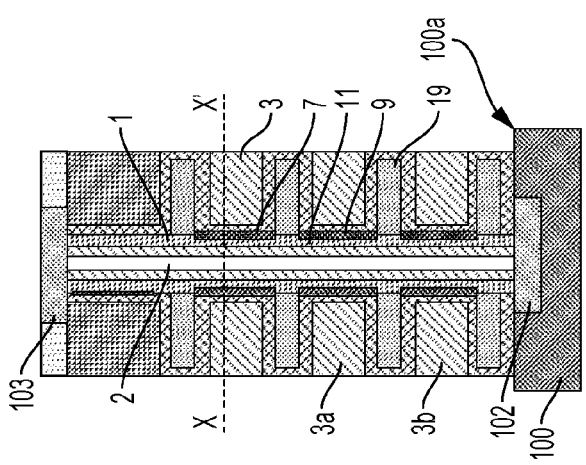
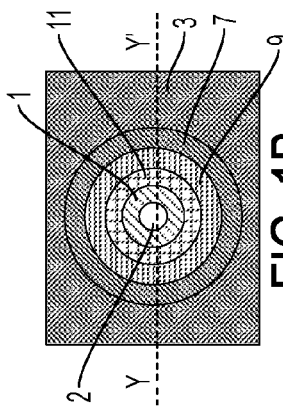
FIG. 1C PRIOR ART
FIG. 1D PRIOR ART

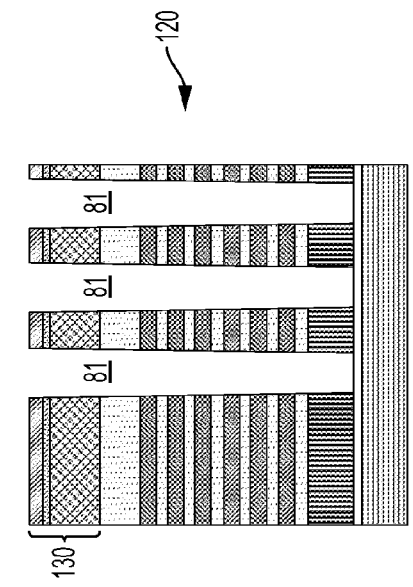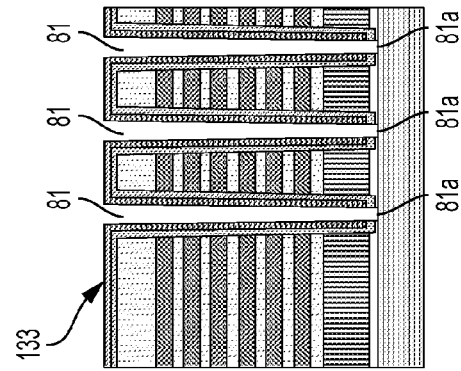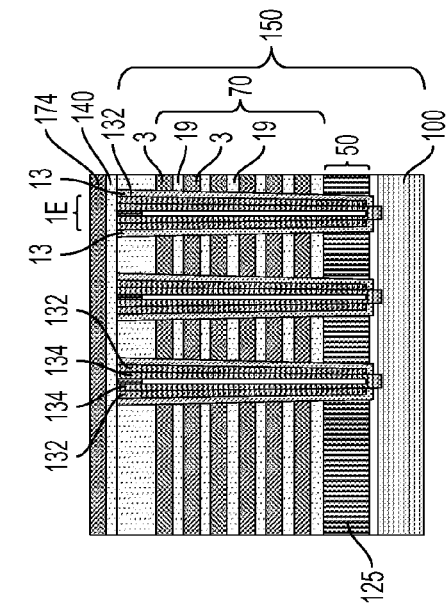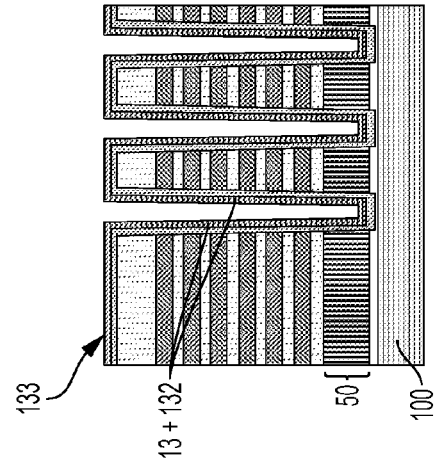

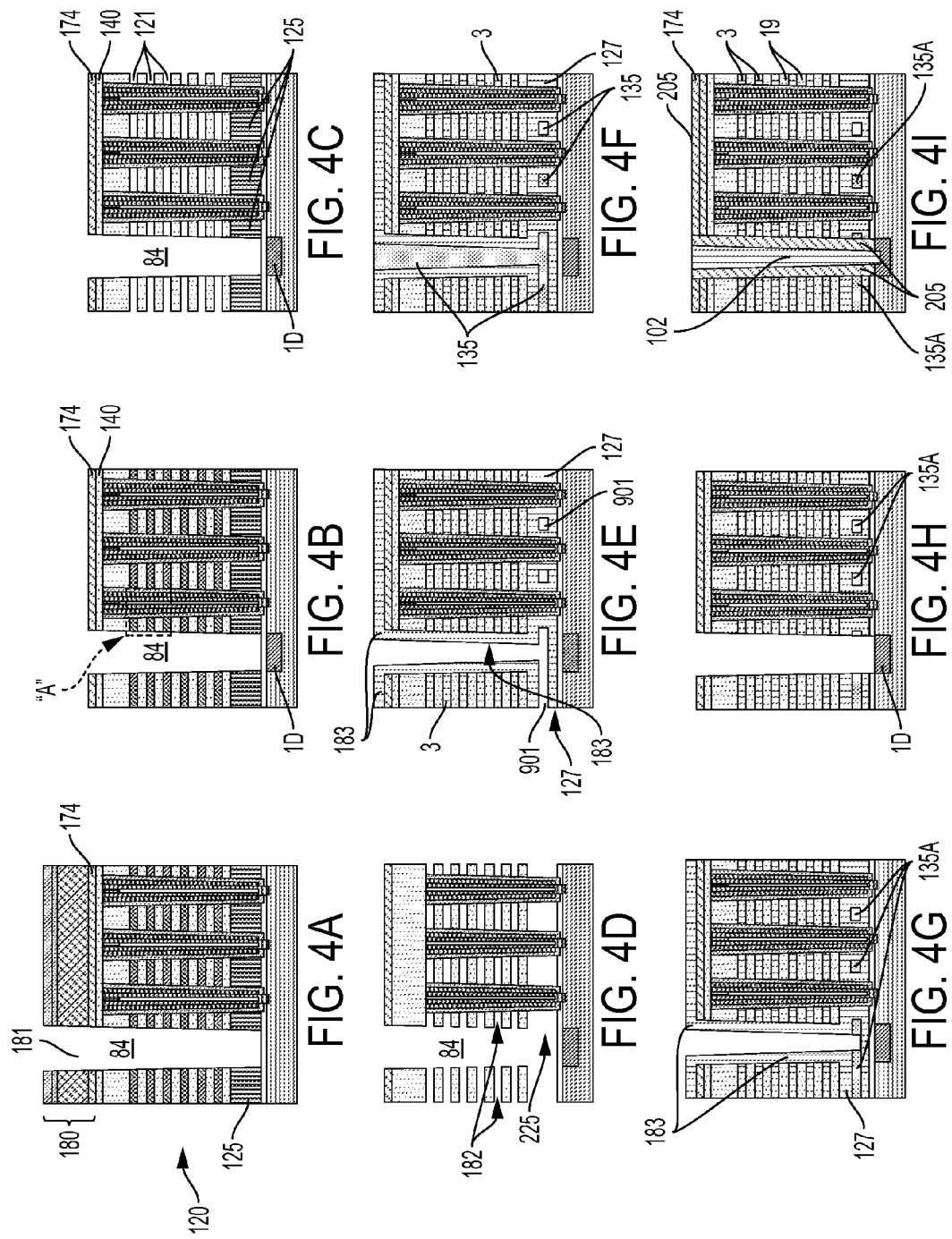

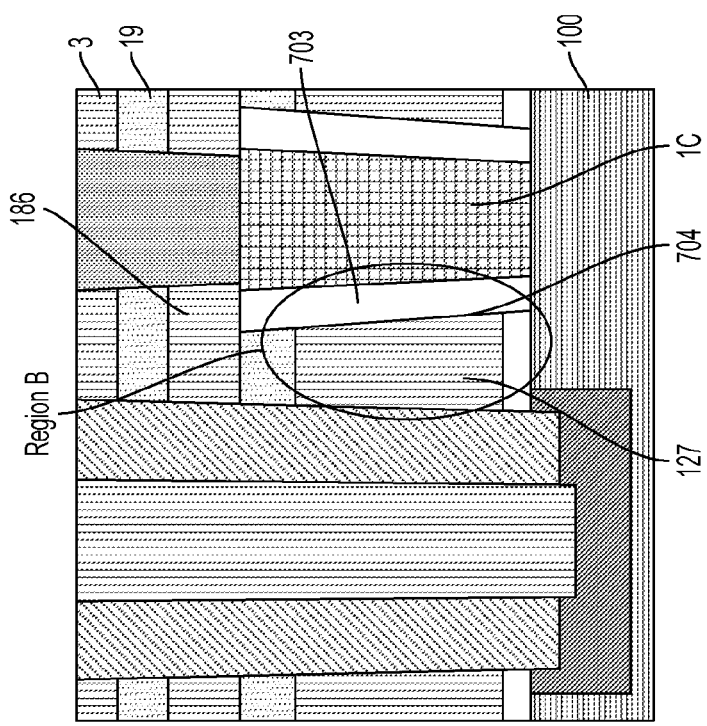
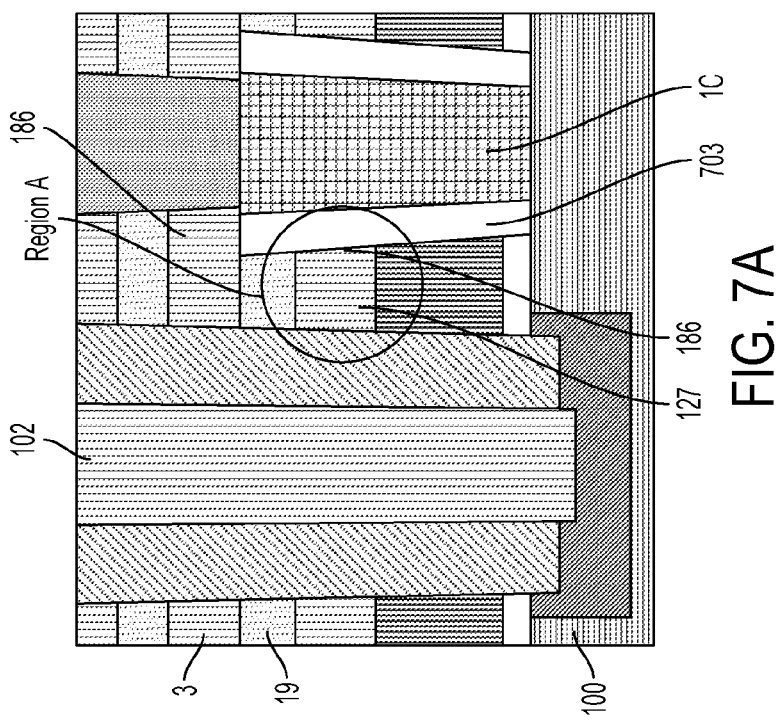

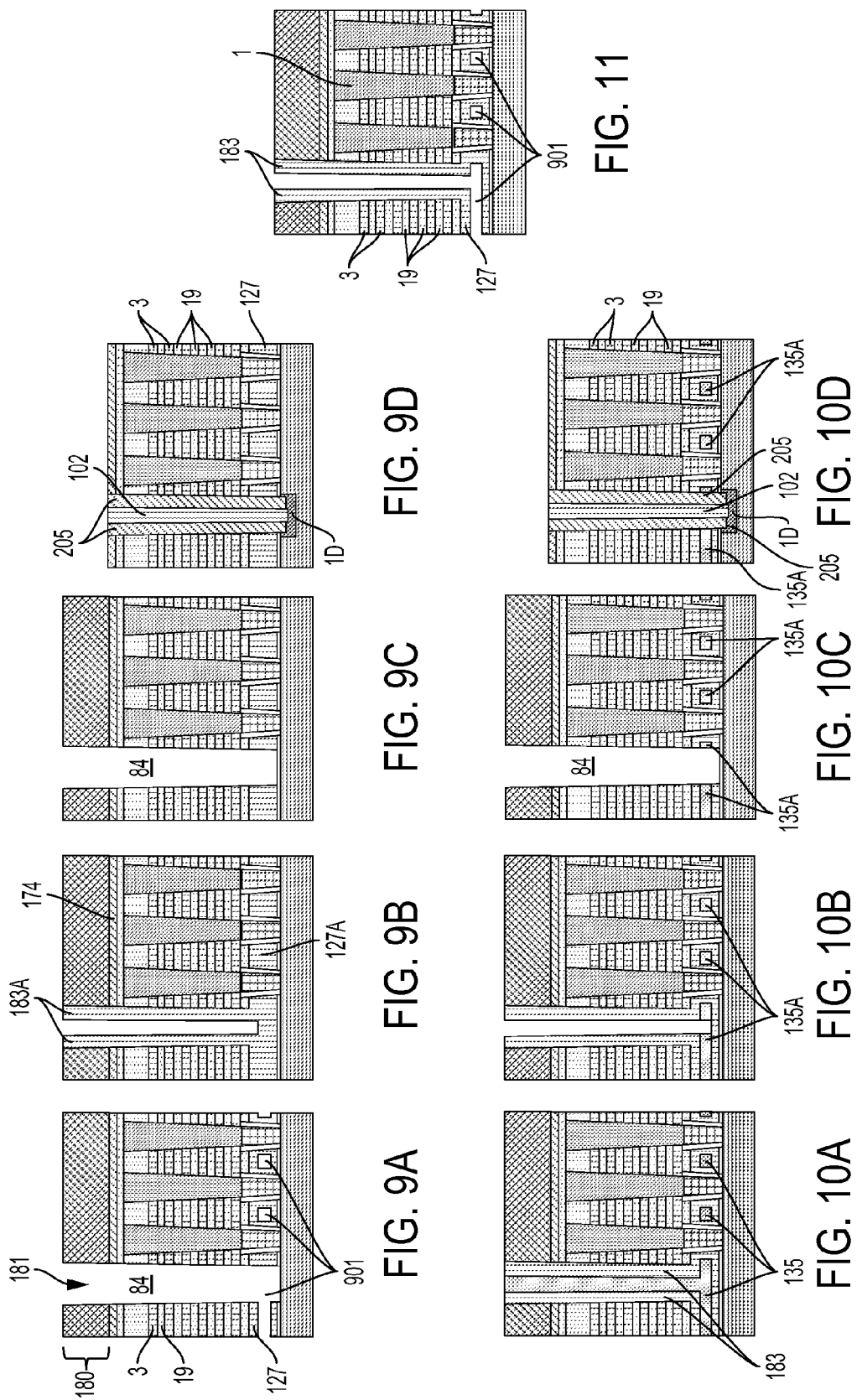

METHOD OF MAKING A MONOLITHIC THREE DIMENSIONAL NAND STRING USING A SELECT GATE ETCH STOP LAYER

FIELD

The present invention relates generally to the field of semiconductor devices and specifically to three dimensional vertical NAND strings and other three dimensional devices and methods of making thereof.

BACKGROUND

Three dimensional vertical NAND strings are disclosed in an article by T. Endoh, et. al., titled "Novel Ultra High Density Memory With A Stacked-Surrounding Gate Transistor (S-SGT) Structured Cell", IEDM Proc. (2001) 33-36. However, this NAND string provides only one bit per cell. Furthermore, the active regions of the NAND string is formed by a relatively difficult and time consuming process involving repeated formation of sidewall spacers and etching of a portion of the substrate, which results in a roughly conical active region shape.

SUMMARY

An embodiment relates to a method of making a monolithic three dimensional NAND string, comprising forming a select gate layer of a third material over a major surface of a substrate, forming a stack of alternating first material and second material layers over the select gate layer, where the first material, the second material and the third material are different from each other. Etching the stack using a first etch chemistry is then performed to form at least one opening in the stack at least to the select gate layer, such that the select gate layer acts as an etch stop layer during the step of etching. Next, etching the select gate layer is performed using a second etch chemistry, where the second etch chemistry is different from the first etch chemistry, followed by forming a semiconductor channel and at least one charge storage region of the NAND string in the stack. At least one end portion of the semiconductor channel extends substantially perpendicular to the major surface of the substrate, where the at least one charge storage region is located adjacent to semiconductor channel.

It is appreciated that the at least one opening may actually comprise a plurality of memory openings, and the step of further etching the select gate layer comprises further etching the plurality of memory openings to form a plurality of extended memory openings which extend through the select gate layer. Subsequent steps may include forming the semiconductor channel and at least one charge storage region of the NAND string in the stack, where this step comprises forming a respective semiconductor channel of a plurality of semiconductor channels and a respective charge storage region of a plurality of charge storage regions in each extended memory opening of the plurality of extended memory openings.

Another embodiment relates to a three dimensional NAND device, comprising a substrate, a semiconductor channel, where at least one end portion of the semiconductor channel extends substantially perpendicular to a major surface of the substrate. The device further comprises at least one charge storage region located adjacent to semiconductor channel, and a plurality of control gate electrodes extending substantially parallel to the major surface of the substrate. The plurality of control gate electrodes comprise at least a first control gate electrode located in a first device level and a second control gate electrode located in a second device level located over the major surface of the substrate and below the first device level. The device also comprises a select gate electrode located between the major surface of the substrate and the plurality of control gate electrodes. The material of the select gate electrode is different from a material of the plurality of control gate electrodes. In one embodiment, the select gate electrode comprises tungsten silicide and the plurality of control gate electrodes comprises tungsten or tungsten and titanium nitride.

Another embodiment relates to a three dimensional NAND device, comprising a substrate, and a semiconductor channel, where at least one end portion of the semiconductor channel extends substantially perpendicular to a major surface of the substrate. The disclosed three dimensional NAND device further comprises at least one charge storage region located adjacent to the semiconductor channel, and a plurality of control gate electrodes extending substantially parallel to the major surface of the substrate. The plurality of control gate electrodes comprise at least a first control gate electrode located in a first device level and a second control gate electrode located in a second device level located over the major surface of the substrate and below the first device level, and a select gate electrode located between the major surface of the substrate and the plurality of control gate electrodes. The select gate electrode contains a hollow space containing a filler material between upper and lower horizontal portions of the select gate electrode. In one embodiment, the select gate electrode may comprise a tungsten or tungsten and titanium nitride and the filler material comprises carbon.

BRIEF DESCRIPTION OF THE DRAWINGS

FIGS. 1A-1B are respectively side cross sectional and top cross sectional views of a NAND string of one embodiment. FIG. 1A is a side cross sectional view of the device along line Y-Y' in FIG. 1B, while FIG. 1B is a side cross sectional view of the device along line X-X' in FIG. 1A.

FIGS. 1C-1D are respectively side cross sectional and top cross sectional views of a NAND string of another embodiment. FIG. 1C is a side cross sectional view of the device along line Y-Y' in FIG. 1D, while FIG. 1D is a side cross sectional view of the device along line X-X' in FIG. 1C.

FIG. 3A is a schematic side cross sectional view illustrating a process comprising forming an oxide/nitride/oxide/nitride (ONON) stack on a polysilicon layer.

FIG. 3B is a schematic side cross sectional view illustrating a step in the method of making a three dimensional memory device comprising reactive ion etching (RIE) of the ONON stack of FIG. 3A.

FIG. 3C is a schematic side cross sectional view illustrating a step in the method of making a three dimensional memory device comprising reactive ion etching (RIE) of the Polysilicon layer of FIG. 3A.

FIG. 3D is a schematic side cross sectional view illustrating another step in the method of making a three dimensional memory device according to an embodiment.

FIG. 3E is a schematic side cross sectional view illustrating another step in the method of making a three dimensional memory device according to an embodiment.

FIG. 3F is a schematic side cross sectional view illustrating another step in the method of making a three dimensional memory device according to an embodiment.

FIG. 4A is a schematic side cross sectional view illustrating a slit trench formation process in a method of making a three dimensional memory device according to an embodiment.

FIG. 4B is a schematic side cross sectional view illustrating another step in the method of making a three dimensional memory device comprising n+ implantation.

FIG. 4C is a schematic side cross sectional view illustrating a step in the method of making a three dimensional memory device comprising wet etching of the nitride layers.

FIG. 4D is a schematic side cross sectional view illustrating another step in the method of making a three dimensional memory device according to an embodiment comprising etching of the Polysilicon layer.

FIG. 4E is a schematic side cross sectional view illustrating another step in the method of making a three dimensional memory device according to an embodiment comprising W fill.

FIG. 4F is a schematic side cross sectional view illustrating another step in the method of making a three dimensional memory device according to an embodiment comprising CVD of carbon.

FIG. 4G is a schematic side cross sectional view illustrating another step in the method of making a three dimensional memory device according to an embodiment comprising carbon RIE.

FIG. 4H is a schematic side cross sectional view illustrating another step in the method of making a three dimensional memory device according to an embodiment comprising W recess.

FIG. 4I is a schematic side cross sectional view illustrating another step in the method of making a three dimensional memory device according to an embodiment comprising filling the trench with liner $SiO_2$ and contact W.

FIG. 7A is a side cross sectional view of a comparative example structure showing the word line and select gate filled with the same material. FIG. 7B is a side cross sectional view of a structure showing the select gate transistor having a uniform gate insulating layer and different select and control gate materials, according to an embodiment.

FIG. 9A is a schematic side cross sectional view illustrating methods to fill a hollow space in a source side select gate layer according to an embodiment comprising word line recess by RIE. FIG. 10A is a schematic side cross sectional view illustrating methods to fill a hollow space in a source side select gate layer according to an embodiment comprising CVD carbon fill.

FIG. 9B is a schematic side cross sectional view illustrating another step in the method to fill a hollow space in a source side select gate layer according to an embodiment comprising a second W fill. FIG. 10B is a schematic side cross sectional view illustrating another step in the method to fill a hollow space in a source side select gate layer according to an embodiment comprising carbon RIE.

FIG. 9C is a schematic side cross sectional view illustrating another step in the method to fill a hollow space in a source side select gate layer according to an embodiment comprising a second W recess. FIG. 10C is a schematic side cross sectional view illustrating another step in the method to fill a hollow space in a source side select gate layer according to an embodiment comprising a first W recess.

FIGS. 9D and 10D are schematic side cross sectional views illustrating a final step in the method to fill a hollow space in a source side select gate layer according to an embodiment showing the NAND structure after contact, showing W fill in FIG. 9D and carbon fill in FIG. 10D.

FIG. 11 is a schematic side cross sectional view illustrating a device having a select gate electrode that is not fully filled.

DETAILED DESCRIPTION

Figure 2:
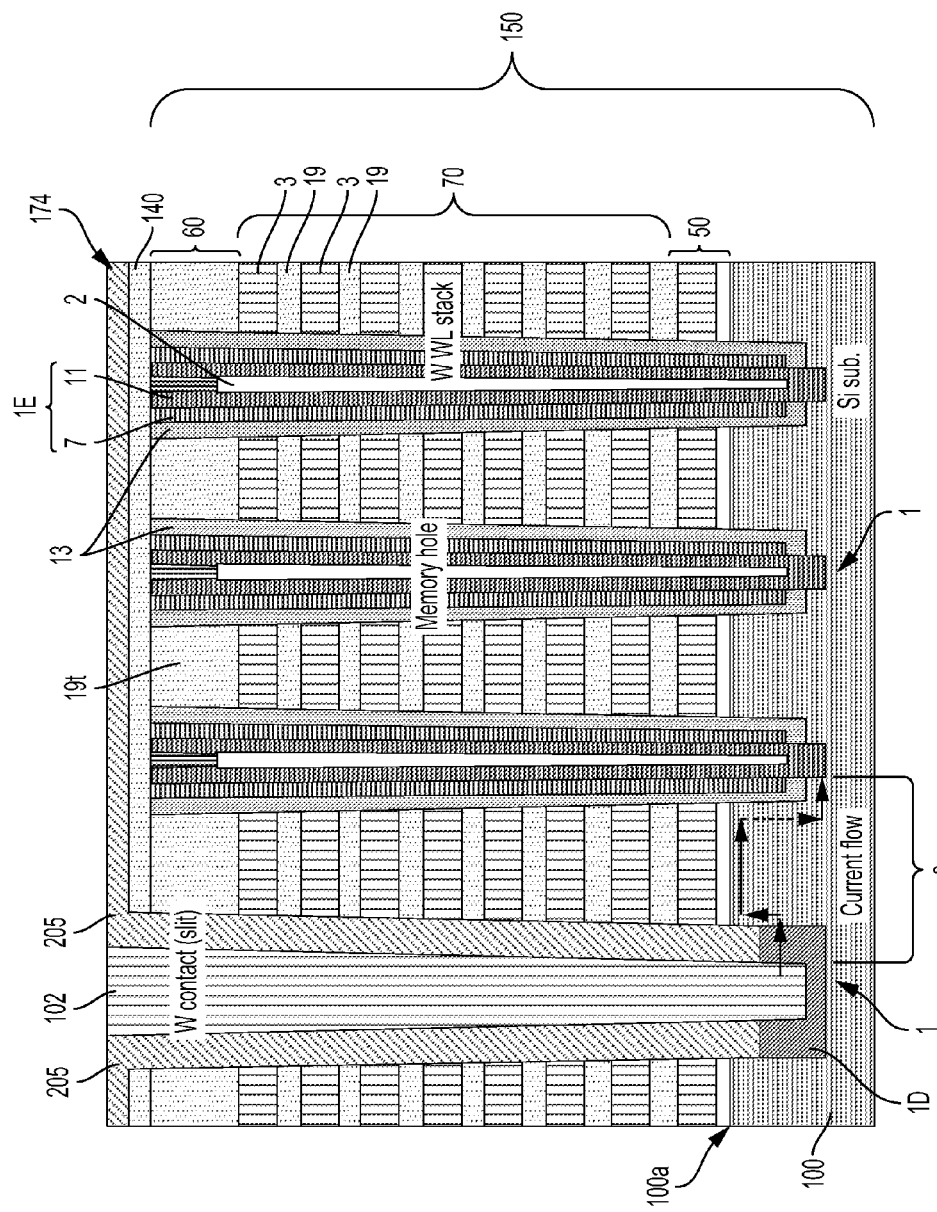
FIG. 2 is a schematic side cross sectional view of a conventional NAND structure.

The embodiments of the invention provide a select gate transistor for a NAND device where the semiconductor channel is located adjacent to at least three sides of the select gate electrode, such as the bottom side and at least two sidewalls of the select gate electrode. The embodiments of the invention provide a longer semiconductor channel with a more reliable, higher quality gate insulating layer and a low resistance metal (e.g., pure metal and/or metal alloy)

select gate in the select gate transistor. In one embodiment, at least one vertical portion of the channel comprises epitaxial, single crystalline silicon. This leads to a higher performance bottom select gate transistor in a vertical NAND device compared to lower performance prior art bottom select gate transistor containing a shorter polysilicon channel, a lower quality gate insulating layer, and high resistance polysilicon select gate electrode.

In various embodiments, the select gate transistor is part of a monolithic, three dimensional array of memory devices, such as an array of vertical NAND strings. The NAND strings are vertically oriented, such that at least one memory cell is located over another memory cell. The array allows vertical scaling of NAND devices to provide a higher density of memory cells per unit area of silicon or other semiconductor material.

A monolithic three dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and adhering the memory levels atop each other, as in Leedy, U.S. Pat. No. 5,915,167, titled "Three Dimensional Structure Memory." The substrates may be thinned or removed from the memory levels before bonding, but as the memory levels are initially formed over separate substrates, such memories are not true monolithic three dimensional memory arrays.

In some prior art NAND structures, after deposition of the various layers, the stack is typically etched to form memory holes and slit trenches. The slit trenches may be filled with a sacrificial material, such as silicon nitride or another material which can be selectively etched compared to materials of the alternating layers, while the channels of the memory cells are subsequently formed in the memory holes. For example, the slit trenches may be formed first using lithography and etching, then the trenches may be filled with the sacrificial material, followed by formation of the memory holes using another lithography and etching step.

When etching conventional stacks having numerous alternating layers, such as eight or more layers, such as 8-64 layers, to form each of the memory holes and the slit trenches with a one step etch process (e.g., with a fluorine based etch) one or more of the memory holes may penetrate through the layer of sacrificial material into bottom conductor layer due to a lack of etch selectivity between the various materials conventionally used. As a result, when these memory holes are filled with semiconducting material to form the channels, short circuits are created via semiconductor or conductive portion(s) of the substrate.

One conventional method of addressing this problem is to provide a thicker bottom insulating layer. However, improvement in the etching profile may to be difficult to achieve with this method. Another conventional method is to etch the layers step by step by alternating with a highly selective etches. However, for large stacks, this method requires a large number separate etch steps which slows throughput and complicates the memory hole/slit trench formation steps. Additionally, to achieve high selectivity, high polymerization plasma is used, which may cause to formation of etch stoppages or blockages (e.g., polymer stringers in memory holes). Further, this method tends to suffer from higher reactive ion etching (RIE) lag (a phenomena in which smaller trenches etch at a slower rate than larger trenches) and RIE microloading (a phenomena in which the etch rate depends on the pattern density).

The inventors have discovered that with the addition of at least one etch stop layer the foregoing over etching problems can be avoided. Accordingly, embodiments of the invention are related to a method to stop stack etching, for example, in memory hole (MH) etching and slit trench (ST) etching by using an etch-stop layer. In one non-limiting embodiment, a Polysilicon is an example of a wet-removable etch stop layer that can be used at the bottom of the stack, which is subsequently replaced with a metal. In another embodiment, tungsten silicide (WSi) is used as a permanent electrically conductive etch stop layer, which is also used as a source side select gate layer. These inventive embodiments are distinct from conventional NAND structures, which do not contain a bottom etch-stop layer, and thus are more susceptible to memory hole and slit trench over-etching into the substrate, which drastically degrade current flow into the memory hole.

FIGS. 1A-1F illustrate a method of making a three dimensional memory device (e.g., vertical NAND string) according to an embodiment disclosed in copending application U.S. patent application Ser. No. 14/133,979, filed on Dec. 19, 2013, hereby incorporated by reference in its entirety. In this embodiment, a substrate 100 is provided with a stack of alternating layers of a first material layer 102 and a second material layer 104 formed over the major surface 100a of the substrate 100.

In some embodiments, the monolithic three dimensional NAND string 150 comprises lower 50 and upper 60 select gate device levels located below and above the memory device levels 70, as shown in FIGS. 2 and 3F. The memory device levels 70 include a semiconductor channel 1 having at least one end portion extending substantially perpendicular to a major surface 100a of a substrate 100, as shown in FIGS. 1A and 1C. For example, the semiconductor channel 1 may have a pillar shape in the memory device levels 70 and the entire pillar-shaped semiconductor channel in the memory device levels 70 extends substantially perpendicularly to the major surface of the substrate 100, as shown in FIGS. 1A and 1C. In these embodiments, the source/drain electrodes of the device can include a first electrode 102 and a second electrode 103 formed over the semiconductor channel 1, as shown in FIGS. 1A and 1C. The NAND string's select or access transistors are not shown in FIGS. 1A-1D for clarity and will be described in more detail below with reference to additional figures.

In some embodiments, the semiconductor channel 1 may be a filled feature, as shown in FIGS. 1C and 1D. In some other embodiments, the semiconductor channel 1 may be hollow, for example a hollow cylinder filled with an insulating fill material 2, as shown in FIGS. 1A and 1B. In these embodiments, an insulating fill material 2 may be formed to fill the hollow part surrounded by the semiconductor channel 1.

The substrate 100 can be any semiconducting substrate known in the art, such as monocrystalline silicon, IV-IV compounds such as silicon-germanium or silicon-germanium-carbon, III-V compounds, II-VI compounds, epitaxial layers over such substrates, or any other semiconducting or non-semiconducting material, such as silicon oxide, glass, plastic, metal or ceramic substrate. The substrate 100 may include integrated circuits fabricated thereon, such as driver circuits for a memory device.

Any suitable semiconductor materials can be used for semiconductor channel 1, for example silicon, germanium, silicon germanium, or other compound semiconductor materials, such as III-V, II-VI, or conductive or semiconductive oxides, etc. The semiconductor material may be amorphous, polycrystalline or single crystal. The semiconductor channel material may be formed by any suitable deposition methods. For example, in one embodiment, the semiconductor channel material is deposited by low pressure chemical vapor deposition (LPCVD). In some other embodiments, the semiconductor channel material may be a recrystallized polycrystalline semiconductor material formed by recrystallizing an initially deposited amorphous semiconductor material.

The insulating fill material 2 may comprise any electrically insulating material, such as silicon oxide, silicon nitride, silicon oxynitride, or other high-k insulating materials.

The channels 1 are electrically connected to source and drain electrodes 102, 103 which are schematically shown in FIGS. 1A and 1C. More detailed description of the electrodes is provided in copending application U.S. patent application Ser. No. 14/133,979, filed on Dec. 19, 2013, which is hereby incorporated by reference in its entirety, specifically in FIGS. 2-4.

The monolithic three dimensional NAND strings 150 in memory device levels 70 further comprise a plurality of control gate electrodes 3, as shown in FIGS. 1A-1D. The control gate electrodes 3 may comprise a portion having a strip shape extending substantially parallel to the major surface 100a of the substrate 100. The plurality of control gate electrodes 3 comprise at least a first control gate electrode 3a located in a first device level (e.g., memory device level A) and a second control gate electrode 3b located in a second device level (e.g., memory device level B) located over the major surface 100a of the substrate 100 and below the device level A. The control gate material may comprise any one or more suitable conductive or semiconductor control gate material known in the art, such as doped polysilicon, tungsten, copper, aluminum, tantalum, titanium, cobalt, titanium nitride, alloys thereof or combination of these materials.

A blocking dielectric 7 is located adjacent to the control gate(s) 3 and may surround the control gate 3. The blocking dielectric 7 may comprise one or more layer having plurality of blocking dielectric segments located in contact with a respective one of the plurality of control gate electrodes 3. Alternatively, the blocking dielectric may comprises one or more continuous layers which extend the entire length of the memory cell portion of the NAND string.

The monolithic three dimensional NAND string also comprise a charge storage region 9. The charge storage region 9 may comprise one or more continuous layers which extend the entire length of the memory cell portion of the NAND string. Alternatively, the charge storage region may comprise a plurality of discrete charge storage regions or segments 9 located between the blocking dielectric 7 and the channel 1.

The discrete charge storage regions 9 may comprise a plurality of vertically spaced apart, conductive (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof), or semiconductor (e.g., polysilicon) floating gates. Alternatively, the charge storage region 9 may comprise an insulating charge trapping material, such as a silicon nitride layer or silicon nitride segments. Alternatively, the charge storage region 9 may comprise conductive nanoparticles, such as metal nanoparticles, for example ruthenium nanoparticles.

The tunnel dielectric 11 of the monolithic three dimensional NAND string is located between charge storage region 9 and the semiconductor channel 1.

The blocking dielectric 7 and the tunnel dielectric 11 may be independently selected from any one or more same or different electrically insulating materials, such as silicon oxide, silicon nitride, silicon oxynitride, or other insulating materials, such as metal oxide materials, for example aluminum oxide or hafnium oxide. The blocking dielectric 7 and/or the tunnel dielectric 11 may include multiple layers of silicon oxide, silicon nitride and/or silicon oxynitride (e.g., ONO layers).

FIG. 2 is a schematic of a conventional NAND structure which does not contain a bottom poly Si layer that prevents over-etching. As a result, memory hole and slit trench maybe over-etched, which drastically degrades current flow 8.

Furthermore, each NAND string 150 contains at least one memory film 13 which is located adjacent to the semiconductor channel 1 portion 1E in the memory device levels 70. Specifically, the memory film 13 is located between the semiconductor channel 1 and the plurality of control gate electrodes 3. The memory film 13 contains the tunnel dielectric 11, the charge storage region(s) 9 (e.g., a charge trapping layer or floating gates), and the blocking dielectric 7.

First Embodiment

In a first embodiment shown in FIGS. 3A to 4I, the select gate layer comprises a sacrificial layer, the first material comprises a first insulating material 19 and the second material comprises a second sacrificial material 121. The select gate layer 125 may comprise a sacrificial etch stop layer. Second sacrificial material layers 121 may comprise insulating material layers, such as silicon nitride layers, while layer 125 may comprise polysilicon, aluminum nitride or carbon (e.g., carbon deposited by CVD). Alternatively, layers 121 may comprise polysilicon and layer 125 may comprise silicon nitride. The method of this embodiment includes the steps shown in FIGS. 4A to 4I, such as etching a trench 84 through the stack 120 to the sacrificial polysilicon etch stop layer 125 using the first etch chemistry after the step of forming the semiconductor channel 1 and at least one charge storage region. Then the trench 84 is etched through the sacrificial polysilicon layer using a second etch chemistry. In this embodiment, the sacrificial select gate/etch stop layer 125 and the second sacrificial material layers 121 are then selectively removed though the trench 84 in the same or in sequential selective etching steps shown in FIGS. 4C and 4D. A metal or metal alloy select gate electrode 127 of the NAND string is then formed through the trench 84 in a location 225 previously occupied by the sacrificial polysilicon layer 125. In this embodiment, a plurality of metal or metal alloy control gate electrodes 3 of the NAND string are formed through the trench in locations 182 previously occupied by the second sacrificial material layers 121 in the same step as forming the select gate electrode 127, as shown in FIG. 4E.

In one aspect of this embodiment, the metal or metal alloy select gate electrode 127 comprises tungsten or a tungsten and titanium nitride material. Likewise, the plurality of metal or metal alloy control gate electrodes 3 may comprise a plurality of tungsten or tungsten and titanium nitride materials.

A source line 102 is then formed in the trench 84, as shown in FIG. 4I. Preferably, forming the source line in the trench comprises forming an insulating layer 205 in the trench 84 and forming a tungsten or a tungsten and titanium nitride source line 102 in the trench over the insulating layer 205. The insulating layer 205 electrically isolates the control gate electrodes 3 from the source line 102, which electrically contacts a portion of the semiconductor channel 1 of the NAND string located in the substrate 100 through the source region 1D.

As used herein, the term "control gate" (CG) and "word line" (WL) refer to the same electrically conductive entity. A control gate may be considered a portion of a word line located adjacent to and controlling one NAND cell in an array of NAND cells. A word line controls plural NAND cells in the array. Thus, the word line may be considered to be a portion of the electrically conductive entity which connects the control gates. However, it should be understood that the word line and its control gate portions may be formed during the same step and may comprise the same one or more electrically conductive layers as will be described below.

FIGS. 3A to 3F illustrate the preliminary steps of forming a semiconductor channel 1 and at least one charge storage region 13 of the NAND string in the stack 120. These steps include forming the respective semiconductor channel 1 of the plurality of semiconductor channels, a respective tunnel dielectric 11 and a respective charge trapping layer or floating gate 9 of the plurality of charge storage regions in each extended memory opening 81 of the plurality of extended memory openings. The method also forming a respective blocking dielectric 7 either in each extended memory opening 81 of the plurality of extended memory openings, as shown in FIG. 3D or through the trench 84 between the steps of selectively removing the second sacrificial material layers 121 and forming the plurality of metal or metal alloy control gate electrodes 3, as shown in FIGS. 5A-5F.

The details of the method steps of FIGS. 3A to 4I of the first embodiment will now be described. Referring to FIG. 3A, a stack 120 of alternating layers 19 and 121 of the memory device levels 70 are formed over the etch stop layer 125 located over the major surface 100A of the substrate 100. Layers 19, 121, 125 may be deposited by any suitable deposition method, such as sputtering, CVD, PECVD, MBE, etc. The layers 19, 121 and 125 may be 6 to 100 nm thick.

In this embodiment, the first layers 19 comprise an electrically insulating material. Any suitable insulating material may be used, such as silicon oxide, silicon nitride, silicon oxynitride, a high-k dielectric (e.g., aluminum oxide, hafnium oxide, etc. or an organic insulating material). The second layers 121 comprise a sacrificial material, such an insulating or semiconductor material. For example, layers 19 may comprise silicon oxide and layers 121 may comprise silicon nitride or silicon, such as amorphous silicon or polysilicon, or another semiconductor material, such as a group IV semiconductor, including silicon-germanium and germanium. Preferably, layers 121 comprise silicon nitride.

Layer 125 may be any etch stop material different from material of layers 19 or 121. For example, layer 125 may comprise polysilicon, when layer 19 is silicon oxide and layer 121 is silicon nitride. In an alternative embodiment, layer 125 may comprise silicon nitride and layers 121 may comprise polysilicon. The deposition of layers 19, 121, is followed by etching the stack 120 to form at least one front side opening 81 in the stack 120 extending to the etch stop layer 125, as shown in FIG. 3B. An array of a front side openings 81 (e.g., cylindrical memory openings or holes) may be formed in locations where vertical channels of NAND strings 150 will be subsequently formed, as shown in FIGS. 3B-3F.

The openings 81 may be formed by photolithography and etching, as follows. First, a memory hole mask 130 is formed over the stack and patterned to form openings 131 exposing the stack 120, as shown in FIG. 3B. Mask 130 may comprise any suitable material, such as one or more layer of photoresist and/or hard mask material described above. Then, the stack 120 is etched using RIE using a first etch chemistry to form the openings 81 in the stack through the openings 131 in mask 130 until the etch stop layer is reached. Each front side memory opening 81 is then further etched using a different, second etch chemistry through the polysilicon etch stop layer 125 until the single crystal silicon substrate 100 is reached in the opening 81, as shown in FIG. 3C.

Then, as shown in FIG. 3D, the memory film 13 is formed in the memory openings 81 and over the stack 120. Specifically, this step includes forming a blocking dielectric in the memory opening 81, forming a charge storage region (e.g., silicon nitride layer or a floating gate layer) over the blocking dielectric in the memory opening, and forming a tunneling dielectric over the charge storage region in the memory opening 81.

Then, the memory film 13 is removed from the bottom of the opening 81, as shown in FIG. 3E. A channel 1 portion 1E is formed by depositing channel material, such as a lightly doped or intrinsic polysilicon over the tunnel dielectric layer portion of the memory film 13 in the front side opening 81 and contacting the semiconductor substrate 100 at the bottom of the opening 81, as shown in FIG. 3F. If desired, a high temperature anneal may be performed after forming the channel portion 1E. As discussed above, the entire opening 81 may be filled to form the device illustrated in FIG. 1D. Alternatively, a layer of channel material may first be deposited in the opening 81 followed by deposition of an insulating fill material 2 to form the device illustrated in FIG. 1B.

In a preferred embodiment, the channel may be formed by a multi-step process utilizing a protective layer, as will be described below in more detail. First, a cover semiconductor layer 132, such as an amorphous silicon or polysilicon layer, is formed in the memory openings 81 over the memory film 13 and over the stack 120 as shown in FIG. 3D. Layer 132 protects the memory film 13 from damage during a subsequent etching step.

Then, a hard mask cover layer 133 is formed over layer 132 as shown in FIG. 3D. The hard mask cover layer 133 may comprise an amorphous carbon layer for example. Layer 133 is deposited non-conformally such that layer 133 is located over layer 132 on top of the stack 120, but does not extend into the memory openings 81. Alternatively, layer 133 may be deposited conformally and then patterned by photolithography and etching to be removed from the memory openings.

As shown in FIG. 3E, the memory film 13 (e.g., the blocking dielectric, the charge storage region and the tunnel dielectric) and layer 132 are removed from a bottom of the memory openings 81 using RIE or another suitable anisotropic etching method. The cover semiconductor layer 132 protects the memory film 13 on the sidewalls of the memory openings 81 from etching damage, and the hard mask cover layer 133 protects the rest of the stack from being etched. The etching step forms extension portions 81A of the openings 81 which expose the semiconductor substrate 100, which forms part of the channel or the semiconductor protrusions 1C at the bottom of the openings 81, as shown in FIGS. 7B and 8A-8H. The hard mask cover layer 133 is then removed by any suitable method, such as ashing or selective wet etching.

As shown in FIG. 3F, a semiconductor channel body layer 134 is formed in the memory openings 81 such that it makes contact with the semiconductor substrate 100, which forms part of the channel or the semiconductor protrusions 1C exposed in the openings 81. The semiconductor channel body layer 134 comprises a channel material, such as amorphous silicon or polysilicon. Layers 132 and 134 preferably comprise the same materials, and layer 134 contacts layer 132 on the sidewalls of the openings 81. Then, an insulating cap layer 140 and silicon oxide layer 174 are formed over the stack 120. The cap layer 140 is preferably a silicon oxide layer, but may comprise a different insulating materials, such as silicon nitride. The silicon oxide layer 174 is used to form an insulating support column (not shown) by the silicon oxide layer 174 into a column opening (not shown because it is located out of the page in the figure) and over the cap layer 140 followed by planarization, such as a CMP planarization. The support column supports layers 19 when the sacrificial layers 121 are removed, will be described below.

Unlike the conventional structure (see FIG. 2), in which there is no bottom polysilicon etch stop layer, the embodiment disclosed herein comprises a bottom polysilicon layer, which stops the oxide/nitride stack RIE and prevents over etching of the memory opening 81. In other words, after ONON RIE, the polysilicon layer is selectively etched without over-etching (FIG. 3C), followed by filling of the MONOS (e.g., memory film and channel) in memory hole (FIGS. 3D and 3D)).

Back side opening (e.g., slit trench) etching and filling, shown in FIGS. 4A-4I, follows the memory hole etching and filling in FIGS. 3A-3F. As described more below, the slit trench etching process comprises first etching the ONON stack and Polysilicon layers to form the trench, selectively removing the SiN and polysilicon sacrificial layers with different wet etchants, and then filling the resulting recesses with a metal, such as W. For example, FIGS. 4A to 4I illustrate a method of forming the trenches 84, the control gate electrodes 3, the lower (e.g., source side) select gate electrodes and the source electrodes (e.g., source lines) 102.

As shown in FIG. 4A, a mask 180 is formed over layer 174. The mask 180 may be a photoresist and/or hard mask described above. At least one back side mask opening 181 is formed in the mask.

Then, as shown in FIG. 4B, silicon oxide layers 174 and 140 and the stack 120 are etched through the openings 181 in the mask to form the back side openings (e.g., the trenches) 84 in the stack 120. The two step etching process comprises etching the silicon oxide 19 and silicon nitride 121 layer to the polysilicon etch stop layer 125 with a first nitride and oxide selective etch chemistry, and then etching through the etch stop layer 125 using a different second, polysilicon selective chemistry. As shown in FIG. 4B, a doped semiconductor region 1D is formed through the back side trench 84. The doped region 1D may comprise a heavily doped source region formed by ion implantation. For example, region 1D may comprise an n-type doped region implanted into an undoped (e.g., intrinsic) or lightly doped p-type substrate region to make an ohmic contact with the subsequently formed source line 102.

Then, at least a portion of the sacrificial second material layers 121 (e.g., silicon nitride layers) are removed through the back side openings 84 to form back side recesses 182 between the first material layers 19, as shown in FIG. 4C. Layers 121 may be removed by selective etching, such as a silicon nitride selective etching which removes silicon nitride layers 121 but does not remove the silicon oxide layers 174, 140, 19 and 7 or the polysilicon etch stop layer 125, as shown in FIG. 4C. The selective etch may stop on the oxide blocking dielectric, such as a silicon oxide blocking dielectric 7 which forms the outer part of the memory film 13.

Next, as shown in FIG. 4D, at least a portion of the polysilicon sacrificial etch stop layer 125 is etched using a different wet etchant than is used to remove silicon nitride layers 121. For example, while hot $H_3PO_4$ may be used to selectively etch silicon nitride (e.g., $Si_3N_4$ or non-stoichiometric version thereof, both of which can be abbreviated as "SiN"), while tetramethyl ammonium hydride (TMAH) may be used to selectively etch Polysilicon to form a select gate recess 225.

Metal or metal alloy control gate electrodes 3 are then formed in the back side recesses 182 through the back side openings 84, and metal or metal alloy select gate electrode 127 is formed in the recess 225 in the location previously occupied by the sacrificial polysilicon layer 125, as shown in FIG. 4E. A portion 183 of the metal or metal alloy control gate material partially or fully fills the back side openings (e.g., trenches) 84 and is located over layer 174. The control gate electrode 3 and select gate electrode 127 materials may comprise the same material selected from any suitable materials described above. For example, the material may comprise a TiN liner and tungsten gate material, which forms control gate electrodes 3 and select gate electrodes 127 in same deposition step. Then, as shown in FIG. 4H, the portion 183 of the metal or metal alloy control gate material is removed by anisotropic etching from the back side openings (e.g., trenches) 84 and from over layer 174 without removing the control gate electrodes 3 and the select gate electrode 127 to complete the formation of the control gate electrodes 3 and the select gate electrode 127 in the same step.

In the metal select gate electrode fill process, when the thickness of polysilicon etch stop layer 125 is sufficiently large, then the select gate recess 225 has a relatively large height, and the metal (e.g., tungsten) select gate ("SG") electrode 127 may not fully fill the recess 225 and form hollow space(s), such as voids 901 in the middle of the SG electrode 127. In this case, the optional process steps shown in FIGS. 4F, 4G, and 4H may be used. After the tungsten SG electrode 127 fill step, the spaces 901 and back side opening (e.g., slit trench) 84 are filled by a filler layer 135, such as a carbon layer formed by CVD or another organic material, such as photoresist, as shown in FIG. 4F. The carbon filler layer 135 located in the slit trench 84 is then anisotropically dry-etched, as shown in FIG. 4G. However, the anisotropic etch does not remove the remaining portions 135A of the carbon filler layer located in the hollow spaces 901 in the SG electrode 127 (i.e., in laterally spaced regions from trench 84). Successively, removal of portion 183 of the tungsten select gate layer 127 located in the slit trench 84 and above layer 174 is carried out as described above. The portion 135A the filler layer 135 remaining in the spaces 901 may be retained in the final device. This will be described in more detail below with respect to FIGS. 9A-9D. However, if the hollow space 901 in the SG electrode 127 is desired to be filled with an electrically conductive material, then the remaining portion 135A of the filler layer 135 is removed from the hollow spaces 901 after removing the portion 183 of the tungsten layer and a second metal or metal alloy (e.g., W) fill and successive second metal or metal removal from the slit trench 84 is carried out to fill the hollow spaces 901 in the select gate electrode 127. This will be described in more detail below with respect to FIG. 10A-10D. On the other hand, when the poly Si layer 125 thickness is sufficiently small, then SG-electrode 127 can fully fill the recess 225 in a single metal or metal alloy fill process, such that there are no hollow spaces 901 in the SG electrode and the carbon filler layer 135 may be omitted.

In the process descriptions provided herein, the oxide blocking dielectric 7, nitride charge storage layer 9, oxide tunnel dielectric 11 and semiconductor channel 1 "ONOS" layers of the MONOS type device (which also includes a metal control gate electrodes 3) are all deposited into the front side memory opening 81 and only the metal control gate electrode 3 (i.e., the "M" of MONOS) is formed through the back side opening 84 using a replacement process. However, in another embodiment, one or more of the "ONO" (e.g., layers 7, 9, 11) can be also formed through the back side opening 84 using the replacement process. For example, the "NOS" layers 9, 11 and 1 are deposited into the front side opening 81 and the "MO" layers 3 and 7 are formed through the back side opening 84 using the replacement process, as shown in FIGS. 5A-5F.

Figure 5A:
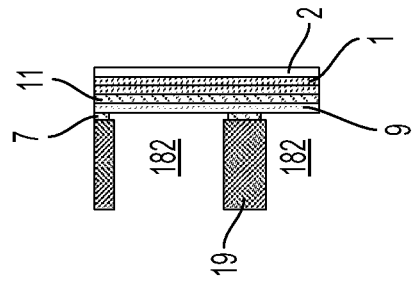
FIGS. 5A-5F are side cross sectional views illustrating steps in an alternative embodiment of forming a blocking dielectric and control gate through the back side opening.
Figure 5B:
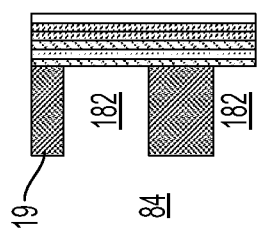
Figure 5C:
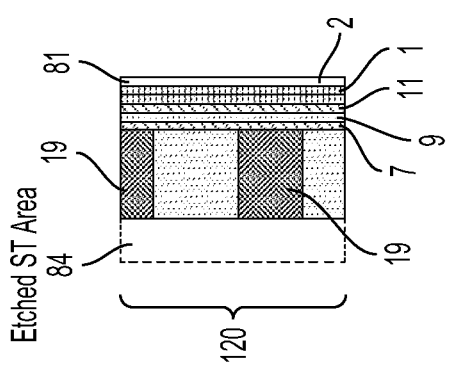

FIGS. 5A-5F illustrate an alternative embodiment control gate electrode 3 and blocking dielectric 7 formation method. FIG. 5A shows a portion of the stack 120 shown in area A in FIG. 4(B). The stack 120 portion shown in FIG. 5A includes layers 19 and 121, a portion of the trench 84 and the memory hole 81 filled with a silicon oxide blocking dielectric layer 7, silicon nitride charge storage layer 9, silicon oxide tunnel dielectric layer 11, channel 1 and silicon oxide insulating fill material 2, in the radially inward direction. Then, as shown in FIG. 5B, the sacrificial silicon nitride layers 121 are selectively removed by a selective wet etch, similar to the step shown in FIGS. 4(C) and 4D to form the recesses 182 exposing the silicon oxide blocking dielectric layer 7. The silicon oxide blocking dielectric layer 7 exposed in the recesses 182 is then removed by a timed selective wet silicon oxide etch, as shown in FIG. 5C. The selective etch also removes a portion of the silicon oxide layers 19 to widen the height of the recesses 182. However, since layers 19 are thicker than layer 7, portions of layers 19 remain after portions of layer 7 exposed in the recesses 182 are removed by the timed etch. The selective etch stops on the silicon nitride charge storage layer 9.

Figure 5D:
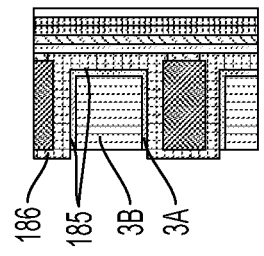

Then, as shown in FIG. 5D, an additional metal oxide blocking dielectric layer 186 is formed in the back side recesses 182 in contact with the charge storage layer 9 through the back side opening 84. The blocking dielectric layer 186 may be any suitable metal oxide layer or layers, such as aluminum oxide, hafnium oxide, etc.

Layer 186 contains a plurality of clam shape regions 185, with one region 185 in each respective recess 182. As used herein a "clam" shape is a side cross sectional shape configured similar to an English letter "C". A clam shape has two segments which extend substantially parallel to each other and to the major surface 100a of the substrate 100. The two segments are connected to each other by a third segment which extends substantially perpendicular to the first two segments and the surface 100a. Each of the three segments may have a straight shape (e.g., a rectangle side cross sectional shape) or a somewhat curved shape (e.g., rising and falling with the curvature of the underlying topography).

The term substantially parallel includes exactly parallel segments as well as segments which deviate by 20 degrees or less from the exact parallel configuration. The term substantially perpendicular includes exactly perpendicular segments as well as segments which deviate by 20 degrees or less from the exact perpendicular configuration. The clam shape preferably contains an opening bounded by the three segments and having a fourth side open.

Figure 5E:
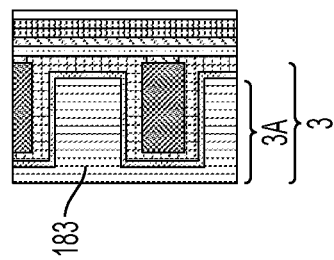
Figure 5F:
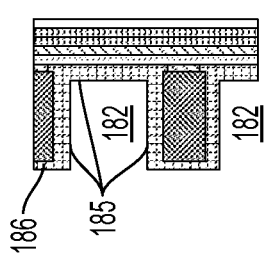

The control gate electrodes 3 are then formed over the additional metal oxide blocking dielectric 186 in the back side recesses 182 through the back side openings 84, as shown in FIG. 5E. The step of forming the control gates comprises forming a titanium nitride liner layer 3A in the back side recesses 182, forming a tungsten layer 3B over the titanium nitride liner layer 3A to fill the back side recesses and at least a portion of the back side trench 84, followed by recessing (e.g., removing) the portion 183 of the tungsten layer 3B from the back side trench 84, as shown in FIG. 5F (similar to the step shown in FIG. 4H). Each clam shaped region 185 surrounds a respective one of the plurality of control gate electrodes 3, as shown in FIG. 5F.

After the step of recessing the tungsten layer 3B shown in either FIG. 4H or FIG. 5F, the insulating layer 205, such as a silicon oxide layer, is formed on sidewalls and bottom of the back side trenches 84, as shown in FIG. 4I. Layer 205 is also formed over layer 174. The insulating layer 205 is then removed from the bottom 84a of the back side trench 84 by anisotropic etching (e.g., by RIE spacer etch) without removing the insulating layer from the sidewalls of the trench 84, as shown in FIG. 4I. This etching step exposes the doped source region 1D located through the bottom 84a of the trench 84.

The source line 102 is then formed in the back side trench 84 in contact with the doped source semiconductor region 1D, as shown in FIG. 4I. The source line 102 may be formed by depositing any suitable metal or metal alloy layers, such as TiN and tungsten over layer 205 in the trenches 84. A portion of the source line material located over the device is removed by CMP or etching to leave the source line 102 in the dielectrically insulated trenches 84, as shown in FIG. 4I.

Second Embodiment

In a second embodiment, a metal silicide, such as tungsten silicide (e.g., stoichiometric $WSi_2$ or non-stoichiometric variants thereof, which are both abbreviated as "WSi") is used as a permanent select gate and etch stop layer. Other silicide materials, such as titanium silicide, etc. may be used instead. Therefore, prevention or reduction of over etching in memory opening and slit trench fabrication can also be realized by using the silicide, such as WSi as the etch stop layer and select gate electrode. Additionally, since WSi is electrically conductive, it can be used as select gate without replacement shown in FIGS. 4D and 4E. In this case, only the sacrificial nitride layers 121 would need to be replaced with metal or metal alloy control gate electrodes 3, thereby reducing the number of fabrication steps, while not degrading device performance characteristics associated with over etching of the openings. This embodiment is shown in FIGS. 6A-E, which modifies the slit trench etching shown in FIGS. 4A-4H with a permanent SG electrode comprising WSi, in contrast to the sacrificial polysilicon etch stop layer 125 of FIGS. 4A-H.

Figure 6A:
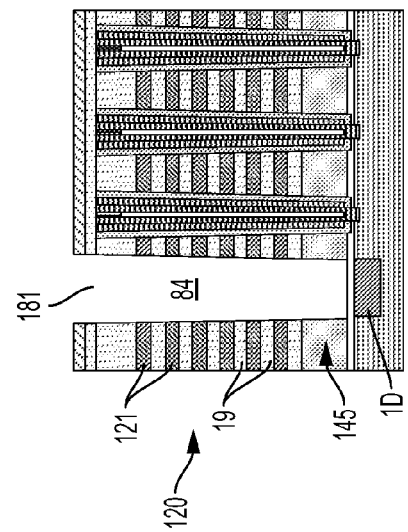
FIG. 6A is a schematic side cross sectional view illustrating a process for RIE of a trench in the method of making a three dimensional memory device according to an embodiment.

The method of the second embodiment include forming the semiconductor channel 1 and at least one charge storage region 13, as shown in FIGS. 3A-3F and as described above, followed by etching a trench 84 through the stack 120 to the silicide select gate electrode 145 using the first etch chemistry. Next, the trench 84 is extended through the select gate electrode 145 using the second etch chemistry, as shown in FIG. 6A.

Figure 6B:
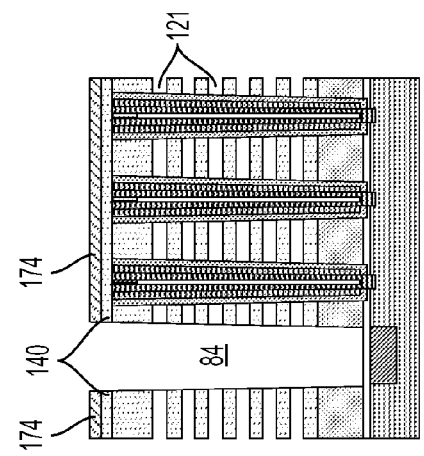
FIG. 6B is a schematic side cross sectional view illustrating another step in the method of making a three dimensional memory device comprising wet etching of the nitride layers.
Figure 6C:
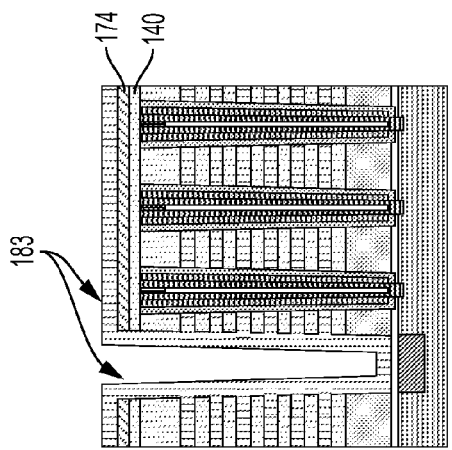
FIG. 6C is a schematic side cross sectional view illustrating another step in the method of making a three dimensional memory device comprising filling the trench with W.
Figure 6D:
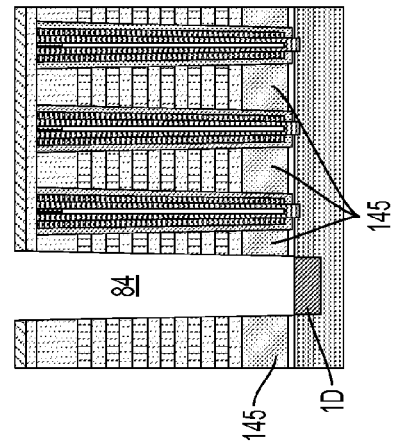
FIG. 6D is a schematic side cross sectional view illustrating another step in the method of making a three dimensional memory device according to an embodiment comprising W recess.
Figure 6E:
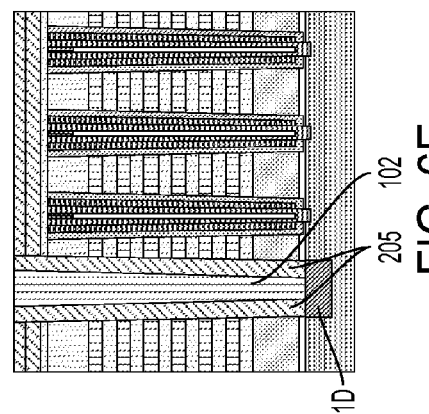
FIG. 6E is a schematic side cross sectional view illustrating another step in the method of making a three dimensional memory device according to an embodiment showing final contact.

This step is followed by selectively removing the second sacrificial second g material layers (e.g., silicon nitride or polysilicon layers) 121 though the trench 84, as shown in FIG. 6B. A plurality of metal or metal alloy control gate electrodes 3 of the NAND string are then formed through the trench 84 in locations previously occupied by layers 121, as shown in FIG. 6C. Then, a source line 102 is formed in the trench 84, as shown in FIG. 6E.

In this embodiment, the material of the plurality of metal or metal alloy control gate electrodes 3 is different from a material of the select gate electrode 145.

In one embodiment, the metal or metal alloy select gate electrode 145 comprises a metal silicide, such as a tungsten silicide (WSi) select gate electrode, and the plurality of metal or metal alloy control gate electrodes 3 comprise a plurality of tungsten or tungsten and titanium nitride control gate electrodes.

The details of the method steps of FIGS. 6A-6E of the second embodiment will now be described. As noted above, the method of the second embodiment uses the permanent select gate/etch stop material, such as WSi layer 145, instead of the sacrificial material 125, such as polysilicon, of the first embodiment.

Referring to FIG. 6A, there is shown at least one opening 181 is formed in the mask (not shown). Preferably, a plurality of openings 181 are formed in the mask. Then, layers 174 and 140 and the stack 120 are etched through the openings 181 in the mask to form the back side openings (e.g., the trenches) 84 in the stack 120. In the disclosed two step etch process, a first etch is performed to the WSi etch stop layer/SG electrode 145 located under stack 120 using a first etch chemistry which is selective for the oxide 19 and nitride 121 layers over WSi layer 145, followed by an etch step through the WSi layer 145 to substrate 100 using a different second etch chemistry which is selective for WSi compared to oxide and nitride layers. A doped semiconductor region 1D is then formed through the back side trench 84. The doped region 1D may comprise a heavily doped source region formed by ion implantation. For example, region 1D may comprise an n-type doped region implanted into an undoped (e.g., intrinsic) or lightly doped p-type regions in substrate 100 to make an ohmic contact with the subsequently formed source line 102.

Then, at least a portion of the sacrificial second material layers 121 are removed through the back side openings 84 to form back side recesses 182 between the first material layers 19, as shown in FIG. 6B. Layers 121 may be removed by selective etching, such as a silicon nitride selective etching which removes silicon nitride layers 121 but does not remove the silicon oxide layers 174, 19 and 7 or the WSi etch stop layer 145. The selective etch may stop on the oxide blocking dielectric, such as a silicon oxide blocking dielectric 7 which forms the outer part of the memory film 13.

Metal or metal alloy control gate electrodes 3 are then formed in the back side recesses 182 through the back side openings 84, as shown in FIG. 6C. A portion 183 of the metal or metal alloy control gate material partially or fully fills the back side openings (e.g., trenches) 84 and is located over layer 174. The control gate electrode 3 material may comprise any suitable materials described above. For example, the material may comprise a TiN liner and tungsten gate material. Then, as shown in FIG. 6D, the portion 183 of the metal or metal alloy control gate material is removed by anisotropic etching from the back side openings (e.g., trenches) 84 and from over layer 174 without removing the control gate electrodes 3 or the WSi select gate electrode 145 to complete the formation of the control gate electrodes 3 and the WSi select gate electrode 145.

Third Embodiment

A third embodiment provides a NAND string 150 made by a multi-step replacement process to fabricate the structure in which the word lines/control gates and select gate are formed separately. FIGS. 7A and 7B are comparisons between the comparative and the embodiment select gate transistor structures. The devices shown in FIGS. 7A and 7B also contain an optional semiconductor pillar 1C which forms a connecting part of the NAND string channel between the substrate 100 and the portion of the channel in the device level 50, as described in U.S. application Ser. No. 14/133,979, filed on Dec. 19, 2013 and incorporated herein by reference in its entirety. The optional pillars 1C may also be formed in the devices of FIGS. 3, 4 and 6. Alternatively, the pillars 1C may be omitted in FIG. 7, 8, 9, 10 or 11 if desired.

The select gate electrode 127 and the control gate electrodes 3 in the comparative structure shown in FIG. 7A are formed during the same deposition step. In such device and process, the quality of the gate insulating layer 703 of the select gate transistor depends on the MONOS deposition conditions, which may negatively affect the quality of layer 703. For example, as described above with respect to FIGS. 5A-5F, the device may include an additional metal oxide blocking dielectric layer 186 which is formed in the back side recesses 182 in contact with the charge storage layer 9 through the back side opening 84. The blocking dielectric layer 186 may be any suitable metal oxide layer or layers, such as aluminum oxide, hafnium oxide, etc. However, since the select and control gate electrodes are formed in the same step, the metal oxide blocking layer 186 will also be formed over the gate insulating layer (e.g., silicon oxide gate insulating layer) 703 of the select transistor in addition to being formed adjacent to the control gate electrodes 3, as shown in Region A of FIG. 7A. The presence of the metal oxide blocking dielectric layer 186 between the gate electrode and the channel in the select transistor may negatively affect the performance of the select transistor.

On the other hand, in the embodiment structure of FIG. 7B, the select transistor gate insulating layer 703 may be a single silicon oxide layer because the select gate electrode 127 is formed in a separate step from the control gate electrodes 3 and the metal oxide layer 186 is not formed in the select gate transistor. Thus, the select gate electrode 127 directly contacts the silicon oxide gate insulating layer 703 at interface 704 in Region B of FIG. 7B. This improves the performance of the select gate transistor. In addition to the above advantage, since polysilicon etch stop layer 125 etch chemistry is typically less damaging to the select transistor silicon oxide gate insulating layer 703 compared to etch chemistry used to selectively etch silicon nitride layer 121, the separate control and select gate electrode formation of this embodiment results in a lower damage to the select transistor gate insulating layer 703.

One process used to form the embodiment structure in FIG. 7B is shown in FIGS. 8A-8H. The process is essentially the same as the processes shown in FIGS. 4A-4I. However, the sacrificial layers 121 and etch stop layers 125 are removed in separate steps rather than in the same step as in FIG. 4D. This multi-step replacement process shown in FIGS. 8A-8H, is made possible because the WL sacrificial layers 121 and the sacrificial etch stop layer 125, comprise different materials, such as SiN and polysilicon, respectively.

Figure 8A:
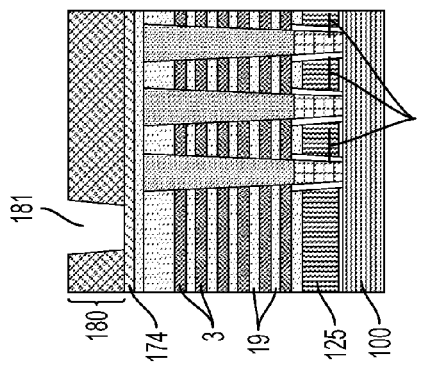
FIG. 8A is a schematic side cross sectional view illustrating a slit trench formation process using RIE through a mask as a step in the method of making a three dimensional memory device according to an embodiment.
Figure 8B:
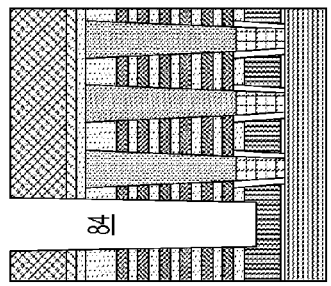
FIG. 8B is a schematic side cross sectional view illustrating another step in the method of making a three dimensional memory device showing an etched slit trench.
Figure 8C:
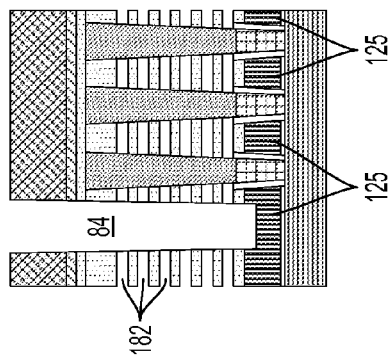
FIG. 8C is a schematic side cross sectional view illustrating a step in the method of making a three dimensional memory device comprising wet etching of the nitride layers.
Figure 8D:
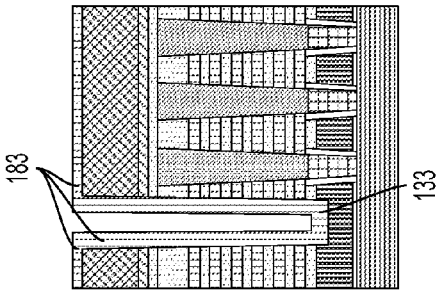
FIG. 8D is a schematic side cross sectional view illustrating another step in the method of making a three dimensional memory device according to an embodiment comprising refilling the area removed in FIG. 8C with tungsten.

The method of the third embodiment include forming the trench 84 through the stack 120 to the sacrificial etch stop/select gate layer 125 (e.g., polysilicon, aluminum nitride, silicon nitride or CVD carbon) without etching the trench through layer 125, as shown in FIG. 8B. The trench 84 may be dry etched via reactive ion etching. Next, the second sacrificial material layers 121 are selectively removed though the trench 84, which is followed by forming a plurality of metal or metal alloy control gate electrodes of the NAND string through the trench in locations previously occupied by the second sacrificial material layers, as shown in FIGS. 8C and 8D.

Figure 8E:
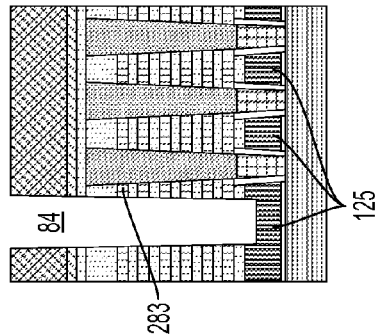
FIG. 8E is a schematic side cross sectional view illustrating another step in the method of making a three dimensional memory device according to an embodiment comprising W recess.
Figure 8F:
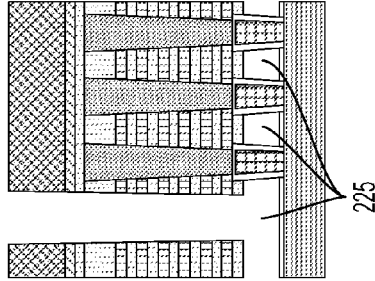
FIG. 8F is a schematic side cross sectional view illustrating another step in the method of making a three dimensional memory device according to an embodiment comprising removal of the polysilicon layer.
Figure 8G:
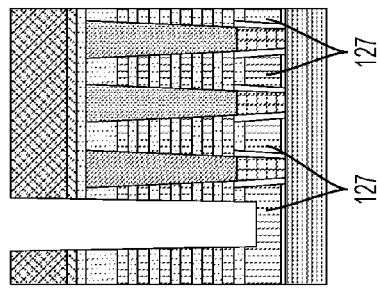
FIG. 8G is a schematic side cross sectional view illustrating another step in the method of making a three dimensional memory device according to an embodiment comprising select gate refill with W.
Figure 8H:
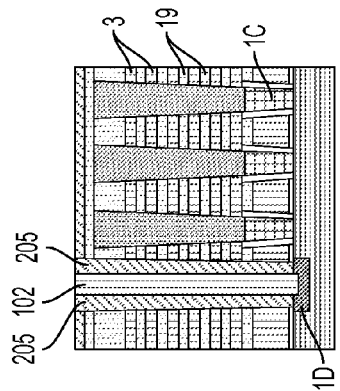
FIG. 8H is a schematic side cross sectional view illustrating another step in the method of making a three dimensional memory device according to an embodiment comprising filling the trench with liner $SiO_2$ and contact tungsten.

At least a portion of residual metal or metal alloy control gate electrode material 183 is then removed from the trench 84 to expose the sacrificial etch stop layer 125, as shown in FIG. 8E. Next, the sacrificial select gate layer/etch stop layer 125 is then selectively removed through the trench, such as by selective wet etching, as shown in FIG. 8F. A metal or metal alloy select gate electrode 127 of the NAND string is then formed through the trench in a location 225 previously occupied by the select gate layer/etch stop layer 125, as shown in FIG. 8G. The source line 120 is then formed in the trench 84, as shown in FIG. 8H.

As in prior embodiments, the metal or metal alloy select gate electrode 127 may comprise a tungsten, tungsten silicide, or a tungsten and titanium nitride select gate electrode, and the plurality of metal or metal alloy control gate electrodes 3 may comprise a plurality of tungsten or tungsten and titanium nitride control gate electrodes.

The above described method may optionally include forming a first semiconductor protrusion 1C and a second semiconductor protrusion 1C that extend perpendicular to the major surface of the substrate 100 such that the first semiconductor protrusion is connected to the second semiconductor protrusion by a third semiconductor region which extends parallel to the major surface of the substrate (e.g., a horizontal channel portion located in the semiconductor substrate). A gate insulating layer 703 of a select gate transistor is then formed over at least a first side of the first semiconductor protrusion, over at least a second side of the second semiconductor protrusion and over a top of the third semiconductor region (e.g., over the substrate), as shown in FIGS. 7B and 8A.

In this aspect of the embodiment, the step of forming the metal or metal alloy select gate electrode 127 typically comprises forming the select gate electrode over the gate insulating layer 703 between the first side of the first semiconductor protrusion 1C, the second side of the second semiconductor protrusion 1C and the top of the third semiconductor region (e.g., over substrate 100), as shown in FIG. 8G.

The first and second semiconductor protrusions 1C may be formed by growing an epitaxial silicon layer over the major surface of the single crystal silicon substrate 100, and patterning the epitaxial silicon layer to form the first and the second semiconductor protrusions which are connected by the third semiconductor region which is located in the single crystal silicon substrate. The gate insulating layer 703 of the select gate transistor can be formed by oxidizing the sides of the first and the second semiconductor protrusions 1C, and the top of the third semiconductor region (e.g., the top surface of the substrate 100).

The respective blocking dielectric may be formed by depositing a silicon oxide layer 7 and an aluminum oxide (or another metal oxide) layer 186 through the trench 84 between the steps of selectively removing the second sacrificial layers 121 and forming the plurality of metal or metal alloy control gate electrodes 3, as shown in FIGS. 5A-5F. Here, the sacrificial polysilicon layer 125 is present during the step of forming the respective blocking dielectric such that the blocking dielectric does not extend into the select gate transistor.

In some of the embodiment methods described herein, the step of removing at least the portion of residual metal or metal alloy control gate electrode material from the trench may optionally comprise removing only a portion of the residual metal or metal alloy control gate electrode material from the trench to leave a metal or metal alloy liner on sidewalls of the trench. As a result, the step of selectively removing the sacrificial select gate/etch stop layer 125 through the trench 84 occurs while the metal or metal alloy liner is present on the sidewalls of the trench.

The details of the method steps of FIGS. 8A-8H of the third embodiment will now be described.

FIG. 8A shows the optional semiconductor protrusions 1C, which comprise epitaxial silicon pillars having a cylindrical, truncated cone or inverse truncated cone shape. The protrusion portions 1C are preferably formed by etching an epitaxial silicon layer located over the substrate 100, as described in the above mentioned U.S. application Ser. No. 14/133,979. Other methods may be used to form the protrusion portions 1C. For example the protrusion portions 1C may be formed by etching the major surface of the substrate 100 such that the portions 1C comprise protruding substrate portions surrounded by a recessed space.

As shown in FIG. 8A, a mask 180 is formed over layer 174. The mask 180 may be a photoresist and/or hard mask described above. At least one back side mask opening 181 is formed in the mask.

As shown in FIG. 8B, the stack 120 is then etched through the openings 181 in the mask to form the back side openings (e.g., the trenches) 84 in the stack 120. The first etching step is then performed which comprises etching the stack 120 to the polysilicon etch stop layer 125 with a first, oxide and nitride selective etch chemistry.

Then, at least a portion of the sacrificial second material layers 121 are removed through the back side openings 84 to form back side recesses 182 between the first material layers 19, as shown in FIG. 8C. Layers 121 may be removed by selective etching, such as a silicon nitride selective etching which removes silicon nitride layers 121 but does not remove the silicon oxide layers 174 and 19 or the polysilicon etch stop layer 125, as shown in FIG. 8C. The selective etch may stop vertically on the etch stop layer 125 and horizontally on the oxide blocking dielectric, such as a silicon oxide blocking dielectric 7 which forms the outer part of the ONO memory film.

Metal or metal alloy control gate electrodes 3 are then formed in the back side recesses 182 through the back side openings 84, as shown in FIG. 8D. A portion 183 of the metal or metal alloy control gate material partially or fully fills the back side openings (e.g., trench) 84 and is located over layer 174. The control gate electrode 3 material may comprise a TiN liner and tungsten gate material.

Then, as shown in FIG. 8E, the portion 183 of the metal or metal alloy control gate material is removed by anisotropic etching from the back side openings (e.g., trenches) 84 and from over layer 174 without removing the control gate electrodes 3 or the etch stop layer 125. A thin tungsten liner portion may remain on the sidewalls of the back side opening 84 after the anisotropic etching step if desired.

Next, as shown in FIG. 8F, at least a portion of the polysilicon sacrificial etch stop layer 125 is etched using a wet, polysilicon selective etching chemistry different from the wet etchant used to remove silicon nitride layers 121, to selectively remove the polysilicon layer 125 to form a select gate recess 225.

If the thin tungsten liner portion remains on the sidewalls of the back side opening, then it protects the metal oxide layer 186 (e.g., aluminum oxide) from damage by the polysilicon selective wet etchant (e.g., TMAH, etc.) used to remove the polysilicon layer 125.

The silicon oxide gate insulating layer of the select transistor is exposed in the lateral portions of the recesses 225. The doped source region 1D may be formed by ion implantation through the back side opening 84 into the substrate 100 at this time. For example, region 1D may comprise an n-type doped region implanted into an undoped (e.g., intrinsic) or lightly doped p-type substrate region to make an ohmic contact with the subsequently formed source line 102.

The select gate recesses 225 are subsequently filled in the back side recesses 182 through the back side openings 84 with a metal or metal alloy to form select gate electrodes 127, as shown in FIG. 8G. As described above, the select gate electrode material may comprise any suitable conductive material, such as a titanium nitride liner layer and tungsten layer on the titanium nitride liner layer. If desired, a blocking dielectric (e.g., silicon oxide layer 7 and/or metal oxide layer 186) may also be formed in the back side recesses 182 through the back side openings 84 prior to forming the select gate electrodes.

As shown in FIG. 8H, the insulating layer 205 and the source line 102 are then formed in the back side opening 84, as described above.

Fourth and Fifth Embodiments

FIGS. 9, 10 and 11 illustrate fourth and fifth embodiments in which the select gate recess 225 has a sufficient height such that back side select gate electrode deposition does not completely fill the recesses and the select gate electrode 127 contains hollow spaces 901, as described above, and as shown in FIGS. 4E and 11. The fourth and fifth embodiment methods fill one or more such hollow spaces 901 in select gate electrode 127.

For example, the fourth embodiment method comprises filling the hollow spaces 901 using an additional metal fill and recess, as shown in FIGS. 9A-9D. Alternatively, the fifth embodiment method includes a using the carbon filler layer 135 to fill hollow spaces 901 that remain in select gate electrode, as shown in FIGS. 10A-10D.

Referring specifically to FIGS. 9A-9D, there is described a first process in which the SG electrode 127 is not fully filled, and comprises hollow spaces 901 that need to be filled. FIG. 9A shows removal or recessing of tungsten portion 183 from the back side opening (e.g., slit trench) 184 of the device of FIG. 11.

As shown in FIG. 9B, a second metal or metal alloy layer (e.g., a tungsten layer) 127A is deposited through the back side opening 84 is used to fill hollow spaces 901 in select gate electrode 127. Then, as shown in FIG. 9C, the upper portion 183A of the metal or metal alloy layer 127A is removed by anisotropic etching from the back side openings (e.g., trenches) 84 and from over layer 174 without removing the control gate electrodes 3 or select gate electrodes 127/127A to complete the filling of the hollow spaces 901 in select gate electrodes with layer 127A. Finally, the insulating layer 205 and source line 102 are formed in trench 84, as shown in FIG. 9D.

In the fifth embodiment, the metal or metal alloy select gate electrode 127 contains a hollow space 901 between upper and lower horizontal portions of the metal or metal alloy select gate electrode. Next, a filler layer 125 is formed over the metal or metal alloy select gate electrode 127, where the filler layer fills the trench 84 and the hollow space 901, as shown in FIG. 10B. A part of the filler layer and a part of the metal or metal alloy select gate electrode which are located in the trench are subsequently removed, as shown in FIG. 10C. Then, an insulating layer 205 is formed in the trench and a metal or metal alloy source line 102 is formed in the trench over the insulating layer 205, as shown in FIG. 10D.

The details of the method of the fifth embodiment will now be described with reference to FIGS. 10A-10D, in which hollow spaces 901 in the SG electrode 127 are filled with the filler layer 135, similar to the process shown in FIGS. 4F-4I. For example, FIG. 10A shows a CVD process for depositing a carbon filler layer in the back side openings (e.g., trenches) 84 to fill the hollow spaces 901.

Next, as shown in FIG. 10B, anisotropic etch of the carbon filler layer 135 in trench 84 is performed without removing 135a portions of layer 135 in hollow spaces 901 located laterally from trench 84.

Then, as shown in FIG. 10C, the portion 183 of the metal or metal alloy control gate material is removed by anisotropic etching from the back side openings (e.g., trenches) 84 and from over layer 174 without removing the carbon previously deposited into the hollow spaces 901 in the SG electrode layer 127. Finally, as shown in FIG. 10D, the insulating layer 205 and source line 102 are formed in trench 84.

Although the foregoing refers to particular preferred embodiments, it will be understood that the invention is not so limited. It will occur to those of ordinary skill in the art that various modifications may be made to the disclosed embodiments and that such modifications are intended to be within the scope of the invention. All of the publications, patent applications and patents cited herein are incorporated herein by reference in their entirety.

What is claimed is:

1. A method of making a monolithic three dimensional NAND string, comprising:
    forming a select gate layer of a third material over a major surface of a substrate;
    forming a stack of alternating first material and second material layers over the select gate layer, wherein the first material, the second material and the third material are different from each other;
    etching the stack using a first etch chemistry to form at least one opening in the stack at least to the select gate layer, such that the select gate layer acts as an etch stop layer during the step of etching;
    further etching the select gate layer using a second etch chemistry, wherein the second etch chemistry is different from the first etch chemistry; and
    forming a semiconductor channel and at least one charge storage region of the NAND string in the stack;
    wherein at least one end portion of the semiconductor channel extends substantially perpendicular to the major surface of the substrate; and
    wherein the at least one charge storage region is located adjacent to semiconductor channel.

2. The method of claim 1, wherein:
the at least one opening comprises a plurality of memory openings;
the step of further etching the select gate layer comprises further etching the plurality of memory openings to form a plurality of extended memory openings which extend through the select gate layer; and
forming the semiconductor channel and at least one charge storage region of the NAND string in the stack comprises forming a respective semiconductor channel of a plurality of semiconductor channels and a respective charge storage region of a plurality of charge storage regions in each extended memory opening of the plurality of extended memory openings.

3. The method of claim 2, wherein the select gate layer comprises a sacrificial layer, the first material comprises a first insulating material and the second material comprises a second sacrificial material.

4. The method of claim 3, further comprising:
etching a trench through the stack to the sacrificial layer using the first etch chemistry after the step of forming the semiconductor channel and at least one charge storage region;
further etching the trench through the sacrificial layer using the second etch chemistry;
selectively removing the sacrificial layer and the second sacrificial material layers though the trench;
forming a metal or metal alloy select gate electrode of the NAND string through the trench in a location previously occupied by the sacrificial layer;
forming a plurality of metal or metal alloy control gate electrodes of the NAND string through the trench in locations previously occupied by the second sacrificial material layers; and
forming a source line in the trench.

5. The method of claim 4, wherein:
the sacrificial layer comprises polysilicon;
the metal or metal alloy select gate electrode comprises a tungsten or a tungsten and titanium nitride select gate electrode;
the plurality of metal or metal alloy control gate electrodes comprise a plurality of tungsten or tungsten and titanium nitride control gate electrodes;
the first material comprises silicon oxide;
the second material comprises silicon nitride;
the at least one charge storage region comprises a blocking dielectric, a charge trapping layer or floating gate, and a tunnel dielectric which are located between the semiconductor channel and the plurality of metal or metal alloy control gate electrodes;
forming the semiconductor channel and at least one charge storage region of the NAND string in the stack comprises:
    forming the respective semiconductor channel of the plurality of semiconductor channels, a respective tunnel dielectric and a respective charge trapping layer or floating gate of the plurality of charge storage regions in each extended memory opening of the plurality of extended memory openings; and
    forming a respective blocking dielectric either in each extended memory opening of the plurality of extended memory openings or through the trench between the steps of selectively removing the sacrificial second insulating material layers and forming the plurality of metal or metal alloy control gate electrodes;
forming the source line in the trench comprises forming an insulating layer in the trench and forming a tungsten or a tungsten and titanium nitride source line in the trench over the insulating layer;
the insulating layer electrically isolates the control gate electrodes from the source line; and
the source line electrically contacts a portion of the semiconductor channel of the NAND string located in the substrate.

6. The method of claim 2, wherein the select gate layer comprises a metal or metal alloy select gate electrode, the first material comprises a first insulating material and the second material comprises a sacrificial second insulating material.

7. The method of claim 6, further comprising:
etching a trench through the stack to the select gate electrode using the first etch chemistry after the step of forming the semiconductor channel and at least one charge storage region;
further etching the trench through the select gate electrode using the second etch chemistry;
selectively removing the sacrificial second insulating material layers though the trench;
forming a plurality of metal or metal alloy control gate electrodes of the NAND string through the trench in locations previously occupied by the sacrificial second insulating material layers; and
forming a source line in the trench;
wherein a material of the plurality of metal or metal alloy control gate electrodes is different from a material of the select gate electrode.

8. The method of claim 7, wherein:
the metal or metal alloy select gate electrode comprises a tungsten silicide select gate electrode;
the plurality of metal or metal alloy control gate electrodes comprise a plurality of tungsten or tungsten and titanium nitride control gate electrodes;
the first material comprises silicon oxide;
the second material comprises silicon nitride;
the at least one charge storage region comprises a blocking dielectric, a charge trapping layer or floating gate, and a tunnel dielectric which are located between the semiconductor channel and the plurality of metal or metal alloy control gate electrodes;
forming the semiconductor channel and at least one charge storage region of the NAND string in the stack comprises:
    forming the respective semiconductor channel of the plurality of semiconductor channels, a respective tunnel dielectric and a respective charge trapping layer or floating gate of the plurality of charge storage regions in each extended memory opening of the plurality of extended memory openings; and
    forming a respective blocking dielectric either in each extended memory opening of the plurality of extended memory openings or through the trench between the steps of selectively removing the sacrificial second insulating material layers and forming the plurality of metal or metal alloy control gate electrodes;
forming the source line in the trench comprises forming an insulating layer in the trench and forming a tungsten or a tungsten and titanium nitride source line in the trench over the insulating layer;
the insulating layer electrically isolates the control gate electrodes from the source line; and the source line electrically contacts a portion of the semiconductor channel of the NAND string located in the substrate.

9. The method of claim 1, wherein:
the first material comprises a first insulating material;
the second material comprises a sacrificial second insulating material;
the select gate layer comprises a sacrificial polysilicon layer; and
the at least one opening comprises a trench.

10. The method of claim 9, further comprising:
etching a plurality of memory openings in the stack;
forming a respective semiconductor channel of a plurality of semiconductor channels and a respective charge storage region of a plurality of charge storage regions in each memory opening of the plurality of memory openings prior to the step of etching the stack using the first etch chemistry to form at least one trench in the stack;
selectively removing the sacrificial second insulating material layers though the trench;
forming a plurality of metal or metal alloy control gate electrodes of the NAND string through the trench in locations previously occupied by the sacrificial second insulating material layers;
removing at least a portion of residual metal or metal alloy control gate electrode material from the trench to expose the sacrificial polysilicon layer;
performing the step of further etching the select gate layer which comprises selectively removing the sacrificial polysilicon layer through the trench after the step of removing at least a portion of the residual metal or metal alloy control gate electrode material;
forming a metal or metal alloy select gate electrode of the NAND string through the trench in a location previously occupied by the sacrificial polysilicon layer; and
forming a source line in the trench.

11. The method of claim 10, wherein:
the metal or metal alloy select gate electrode comprises a tungsten or a tungsten and titanium nitride select gate electrode;
the plurality of metal or metal alloy control gate electrodes comprise a plurality of tungsten or tungsten and titanium nitride control gate electrodes;
the first material comprises silicon oxide;
the second material comprises silicon nitride;
the step of etching the stack using a first etch chemistry comprises dry etching the stack using reactive ion etching;
the step of further etching the select gate layer using a second etch chemistry comprises selectively removing the sacrificial polysilicon layer through the trench using selective wet etching;
the at least one charge storage region comprises a blocking dielectric, a charge trapping layer or floating gate, and a tunnel dielectric which are located between the semiconductor channel and the plurality of metal or metal alloy control gate electrodes;
forming the semiconductor channel and at least one charge storage region of the NAND string in the stack comprises:
    forming the respective semiconductor channel of the plurality of semiconductor channels, a respective tunnel dielectric and a respective charge trapping layer or floating gate of the plurality of charge storage regions in each memory opening of the plurality of extended memory openings; and
    forming a respective blocking dielectric either in each memory opening of the plurality of memory openings or through the trench between the steps of selectively removing the sacrificial second insulating material layers and forming the plurality of metal or metal alloy control gate electrodes;
forming the source line in the trench comprises forming an insulating layer in the trench and forming a tungsten or a tungsten and titanium nitride source line in the trench over the insulating layer;
the insulating layer electrically isolates the control gate electrodes from the source line; and
the source line electrically contacts a portion of the semiconductor channel of the NAND string located in the substrate.

12. The method of claim 11, further comprising:
forming a first semiconductor protrusion and a second semiconductor protrusion that extend perpendicular to the major surface of the substrate such that the first semiconductor protrusion is connected to the second semiconductor protrusion by a third semiconductor region which extends parallel to the major surface of the substrate; and
forming a gate insulating layer of a select gate transistor over at least a first side of the first semiconductor protrusion, over at least a second side of the second semiconductor protrusion and over a top of the third semiconductor region.

13. The method of claim 12, wherein:
the step of forming the metal or metal alloy select gate electrode comprises forming the select gate electrode over the gate insulating layer between the first side of the first semiconductor protrusion, the second side of the second semiconductor protrusion and the top of the third semiconductor region;
the step of forming the first semiconductor protrusion and the second semiconductor protrusion comprises forming an epitaxial silicon layer over the major surface of the substrate which comprises a single crystal silicon substrate, and patterning the epitaxial silicon layer to form the first semiconductor protrusion and the second semiconductor protrusion connected by the third semiconductor region which is located in the single crystal silicon substrate;
the step of forming the gate insulating layer of the select gate transistor comprises oxidizing the first side of the first semiconductor protrusion, the second side of the second semiconductor protrusion and the top of the third semiconductor region; and
the step of forming the respective blocking dielectric comprises forming a silicon oxide layer and an aluminum oxide layer through the trench between the steps of selectively removing the sacrificial second insulating material layers and forming the plurality of metal or metal alloy control gate electrodes;
wherein the sacrificial polysilicon layer is present during the step of forming the respective blocking dielectric such that the blocking dielectric does not extend into the select gate transistor.

14. The method of claim 10, wherein:
the step of removing at least the portion of residual metal or metal alloy control gate electrode material from the trench comprises removing only a portion of the residual metal or metal alloy control gate electrode material from the trench to leave a metal or metal alloy liner on sidewalls of the trench; and the step of selectively removing the sacrificial polysilicon layer through the trench occurs while the metal or metal alloy liner is present on the sidewalls of the trench.

15. The method of claim 1, further comprising:

selectively removing the select gate layer;

forming a metal or metal alloy select gate electrode of the NAND string through a trench to partially fill the trench and to partially fill a space previously occupied by the select gate layer, wherein the metal or metal alloy select gate electrode contains a hollow space between upper and lower horizontal portions of the metal or metal alloy select gate electrode;

forming a filler layer over the metal or metal alloy select gate electrode, wherein the filler layer fills the trench and the hollow space;

removing a part of the filler layer and a part of the metal or metal alloy select gate electrode which are located in the trench;

forming an insulating layer in the trench; and forming a metal or metal alloy source line in the trench over the insulating layer.

16. The method of claim 15, wherein:

the select gate layer comprises a sacrificial polysilicon layer;

the metal or metal alloy select gate electrode comprises a tungsten or tungsten and titanium nitride select gate electrode;

the filler layer comprises carbon formed by chemical vapor deposition;

the insulating layer comprises silicon oxide; and the metal or metal alloy source line comprises a tungsten or tungsten and titanium nitride source line which electrically contacts a portion of the semiconductor channel of the NAND string located in the substrate.

17. The method of claim 1, further comprising:

selectively removing the select gate layer;

forming a first portion of a metal or metal alloy select gate electrode of the NAND string through a trench to partially fill the trench and to partially fill a space previously occupied by the select gate layer, wherein the first portion of the metal or metal alloy select gate electrode contains a hollow space between upper and lower horizontal portions of the first portion of the metal or metal alloy select gate electrode;

removing a part of the first portion of the metal or metal alloy select gate electrode which is located in the trench;

forming a second portion of the metal or metal alloy select gate electrode of the NAND string through the trench to fill the hollow space;

removing a part of the second portion of the metal or metal alloy select gate electrode which is located in the trench;

forming an insulating layer in the trench; and forming a metal or metal alloy source line in the trench over the insulating layer.

* * * * *